United States Patent
Liu et al.

(10) Patent No.: US 12,009,036 B2
(45) Date of Patent: Jun. 11, 2024

(54) NAND FLASH MEMORY DEVICE AND METHOD OF REDUCING PROGRAM DISTURB THEREOF

(71) Applicant: YANGTZE MEMORY TECHNOLOGIES CO., LTD., Wuhan (CN)

(72) Inventors: Hongtao Liu, Wuhan (CN); Dejia Huang, Wuhan (CN); Wenzhe Wei, Wuhan (CN); Ying Huang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 232 days.

(21) Appl. No.: 17/529,567

(22) Filed: Nov. 18, 2021

(65) Prior Publication Data
US 2023/0132781 A1 May 4, 2023

Related U.S. Application Data

(63) Continuation of application No. PCT/CN2021/127743, filed on Oct. 30, 2021.

(51) Int. Cl.
*G11C 16/10* (2006.01)
*G11C 16/04* (2006.01)
(Continued)

(52) U.S. Cl.
CPC ...... *G11C 16/3459* (2013.01); *G11C 16/0433* (2013.01); *G11C 16/0483* (2013.01);
(Continued)

(58) Field of Classification Search
CPC ............ G11C 16/3459; G11C 16/0483; G11C 16/102; G11C 16/30; G11C 16/3404; G11C 16/3418
See application file for complete search history.

(56) References Cited

U.S. PATENT DOCUMENTS

| 9,087,608 B2 | 7/2015 | Kim |
| 9,460,805 B1 | 11/2016 | Pang et al. |

(Continued)

FOREIGN PATENT DOCUMENTS

| CN | 101556827 A | 10/2009 |
| CN | 103578539 A | 2/2014 |

(Continued)

OTHER PUBLICATIONS

International Search Report issued in corresponding International Application No. PCT/CN2021/127743, dated Jul. 27, 2022, 4 pages.

*Primary Examiner* — Mushfique Siddique
(74) *Attorney, Agent, or Firm* — BAYES PLLC

(57) ABSTRACT

In certain aspects, a memory device includes memory strings each including a drain select gate (DSG) transistor and memory cells, and a peripheral circuit coupled to the memory strings. The peripheral circuit is configured to, in a program/verify cycle, program a target memory cell of the memory cells in a select memory string of the memory strings, and after programming the target memory cell, verify the target memory cell using one or more verify voltages including an initial verify voltage. The peripheral circuit is also configured to compare the initial verify voltage with a threshold verify voltage so as to obtain a comparing result, and control, at least based on the comparing result, the DSG transistor in an unselect memory string of the memory strings between programming and verifying the targe memory cell.

16 Claims, 16 Drawing Sheets

(51) Int. Cl.
  *G11C 16/08*  (2006.01)
  *G11C 16/26*  (2006.01)
  *G11C 16/30*  (2006.01)
  *G11C 16/34*  (2006.01)

(52) U.S. Cl.
  CPC .............. *G11C 16/08* (2013.01); *G11C 16/10* (2013.01); *G11C 16/102* (2013.01); *G11C 16/26* (2013.01); *G11C 16/30* (2013.01); *G11C 16/3404* (2013.01)

(56) References Cited

U.S. PATENT DOCUMENTS

| | | | |
|---|---|---|---|
| 10,665,299 | B1 | 5/2020 | Lu et al. |
| 10,762,973 | B1 * | 9/2020 | Lu .................. G11C 11/5628 |
| 2006/0092703 | A1 | 5/2006 | Chae |
| 2009/0257281 | A1 | 10/2009 | Lee |
| 2009/0282184 | A1 | 11/2009 | Dutta et al. |
| 2012/0051137 | A1 | 3/2012 | Hung et al. |
| 2012/0155168 | A1 | 6/2012 | Kim |
| 2013/0044548 | A1 | 2/2013 | Lo et al. |
| 2016/0118126 | A1 | 4/2016 | Moon |
| 2017/0133095 | A1 | 5/2017 | Park et al. |
| 2017/0352430 | A1 * | 12/2017 | Chen ................. G11C 16/16 |
| 2019/0108883 | A1 | 4/2019 | Yu |
| 2020/0005871 | A1 | 1/2020 | Yang et al. |
| 2021/0210146 | A1 * | 7/2021 | Lee ................... G11C 16/20 |
| 2021/0327511 | A1 | 10/2021 | Liu et al. |
| 2021/0366550 | A1 * | 11/2021 | Cho ............... G11C 16/0483 |
| 2022/0051728 | A1 * | 2/2022 | Chai .............. G11C 16/0483 |
| 2023/0092551 | A1 * | 3/2023 | Sato ................. G11C 11/4094 365/189.011 |
| 2023/0145467 | A1 * | 5/2023 | Yu .................... G11C 11/4096 365/189.011 |

FOREIGN PATENT DOCUMENTS

| | | | | |
|---|---|---|---|---|
| CN | 104821183 | A | | 8/2015 |
| CN | 106486161 | A | | 3/2017 |
| CN | 108028070 | A | | 5/2018 |
| CN | 108389601 | A | | 8/2018 |
| CN | 110910922 | A | | 3/2020 |
| CN | 110959177 | A | | 4/2020 |
| CN | 113228188 | A * | 8/2021 | ......... G11C 16/0483 |
| CN | 113228188 | A | | 8/2021 |
| CN | 113454722 | A | | 9/2021 |
| WO | WO-2021233324 | A1 * | 11/2021 | .............. G11C 16/10 |

* cited by examiner

301

NAND FLASH MEMORY DEVICE AND METHOD OF REDUCING PROGRAM DISTURB THEREOF

CROSS-REFERENCE TO RELATED APPLICATIONS

This application is continuation of International Application No. PCT/CN2021/127743, filed on Oct. 30, 2021, entitled "MEMORY DEVICE AND PROGRAM OPERATION THEREOF," which is hereby incorporated by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes memory strings each including a drain select gate (DSG) transistor and memory cells, and a peripheral circuit coupled to the memory strings. The peripheral circuit is configured to, in a program/verify cycle, program a target memory cell of the memory cells in a select memory string of the memory strings, and after programming the target memory cell, verify the target memory cell using one or more verify voltages including an initial verify voltage. The peripheral circuit is also configured to compare the initial verify voltage with a threshold verify voltage so as to obtain a comparing result, and control, at least based on the comparing result, the DSG transistor in an unselect memory string of the memory strings between programming and verifying the targe memory cell.

In another aspect, a memory system includes a memory device configured to store data, and a memory controller coupled to the memory device. The memory device includes memory strings each including a DSG transistor and memory cells, and a peripheral circuit coupled to the memory strings. The peripheral circuit is configured to, in a program/verify cycle, program a target memory cell of the memory cells in a select memory string of the memory strings, and after programming the target memory cell, verify the target memory cell using one or more verify voltages including an initial verify voltage. The peripheral circuit is also configured to compare the initial verify voltage with a threshold verify voltage so as to obtain a comparing result, and control, at least based on the comparing result, the DSG transistor in an unselect memory string of the memory strings between programming and verifying the targe memory cell. The memory controller is configured to control operations of the memory strings through the peripheral circuit.

In still another aspect, a method for operating a memory device is provided. The memory device includes memory strings each including a DSG transistor and memory cells. In a program/verify cycle, a target memory cell of the memory cells in a select memory string of the memory strings is programed. After programming the target memory cell, the target memory cell is verified using one or more verify voltages including an initial verify voltage. The initial verify voltage is compared with a threshold verify voltage so as to obtain a comparing result. The DSG transistor in an unselect memory string of the memory strings is controlled at least based on the comparing result between programming and verifying the targe memory cell.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
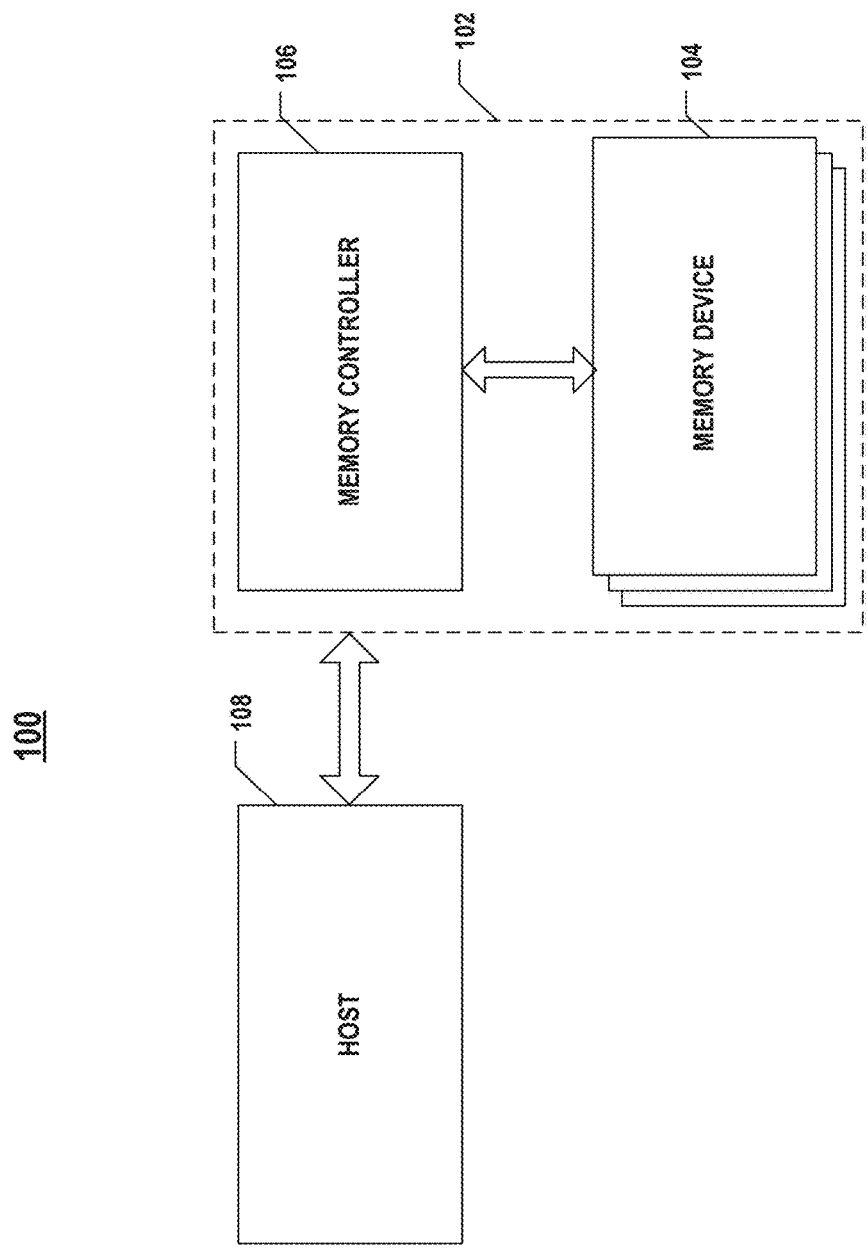
FIG. 1 illustrates a block diagram of a system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

NAND Flash memory devices can perform program (write) operations at the page/word line level, i.e., programming all the memory cells coupled to the same select word line at the same time. Each program operation may involve multiple passes, each having multiple cycles of applying program pulses and verify pulses. In 3D NAND memory devices, the drain select gate (DSG) transistors and/or source select gate (SSG) transistors in unselect memory strings (including memory cells that have passed the program verification) are usually turned off when applying the verify pulses to avoid the leakage interference from the unselect memory strings. A channel potential difference thus may occur in the unselect memory string between the select word line and its adjacent unselect word line due to the channel coupling effect. The channel potential difference, however, can cause hot carrier injection (HCI) to the select memory cell, which disturbs the programming of the select memory cell.

To avoid HCI due to channel potential difference, in some 3D NAND memory devices, a pre-pulse stage is added between applying the program voltage and the verify voltage(s) in each program/verify cycle. During the pre-pulse stage, the DSG transistor and the SSG transistor of an unselect memory string are both turned on to eliminate the channel coupling potential as well as the resulting channel potential difference during the verify stage. However, the additional pre-pulse stage in each program/verify cycle increases the program time.

To address one or more of the aforementioned issues, the present disclosure introduces a solution that adds the pre-pulse stage to a program/verify cycle only when the channel potential difference in the cycle would be large enough. Otherwise, the pre-pulse stage would not be added to the program/verify cycle to reduce the program time. That is, the solution disclosed herein can reduce the disturbance caused by HCI while balancing the program time. Since it is observed that the channel potential difference during the verify stage is associated with the difference between the pass voltage applied to the unselect word lines and the initial verify voltage applied to the select word line at the beginning of the verify stage, the solution disclosed herein can determine a threshold verify voltage that reduces or even minimizes the HCI (e.g., based on the pass voltage) and compare the initial verify voltage with the threshold verify voltage in each program/verify cycle. The comparison result can thus be used to decide whether to include the pre-pulse stage in the cycle. In some implementations, the DSG transistor is turned on during the pre-pulse stage to eliminate the channel potential difference before the verify stage only when the initial verify voltage would not reach the threshold verify voltage. Moreover, in some implementations, the initial verify voltage is set to be the maximum voltage of the multiple verify voltages in the same cycle to increase the chance of eliminating the pre-pulse stage in a program/verify cycle to further save the program time.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104. In order to send or receive data to or from memory devices 104, host 108 can send instructions to memory system 102 besides the data.

Memory device 104 can be any memory device disclosed in the present disclosure. As disclosed below in detail, memory device 104, such as a 3D NAND memory device, can dynamically add or remove a pre-pulse stage between the program stage and the verify stage in each program/verify cycle based on a comparison between the initial verify voltage and a threshold verify voltage. Memory device 104 can include memory strings, for example, NAND memory strings. Consistent with the scope of the present disclosure, memory device 104 can control, at least based on the comparison, the DSG transistor in an unselect memory string between programming and verifying the targe memory cell. For example, memory device 104 may turn off the DSG transistor in the unselect memory string between programming and verifying the target memory cell (i.e., removing the pre-pulse stage) in response to the initial verify voltage being higher than the threshold verify voltage, while turn on the DSG transistor in the unselect memory string in an interval between programming and verifying the target memory cell (i.e., adding the pre-pulse stage) in response to the initial verify voltage being equal to or lower than the threshold verify voltage. As a result, the reduction of the interference to the programming of the target memory cell due to HCI and the saving of the program time can be balanced.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. For example, based on the instructions received from host 108, memory controller 106 may transmit various commands to memory device 104, e.g., program command, read command, erase command, etc., to control the operations of memory device 104.

Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
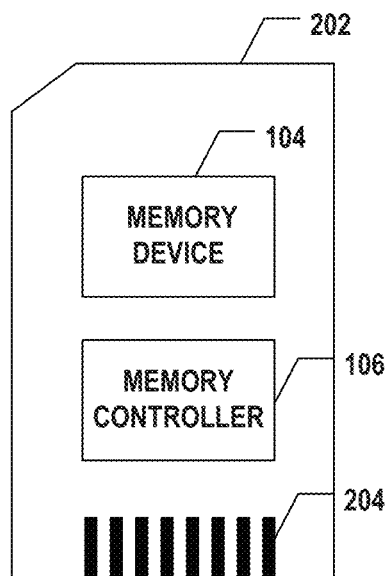
FIG. 2A illustrates a diagram of a memory card having a memory device, according to some aspects of the present disclosure.
Figure 2B:
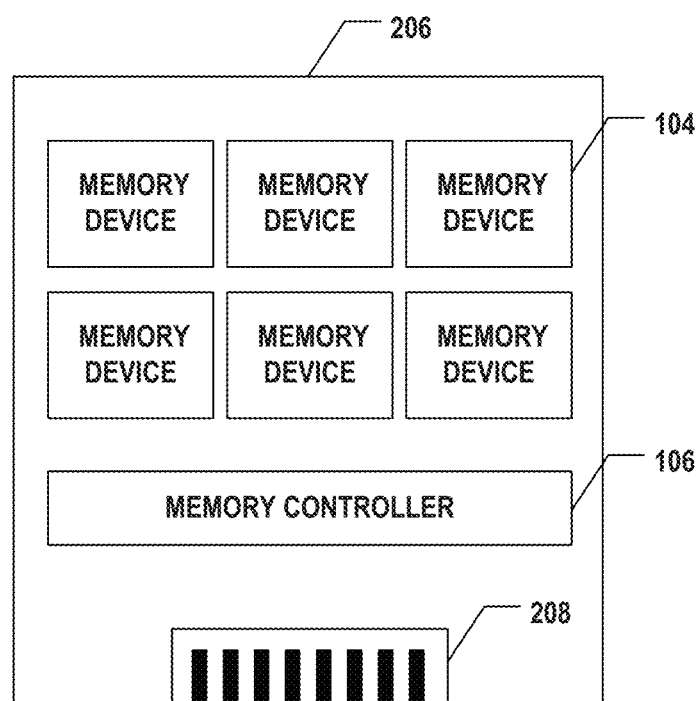
FIG. 2B illustrates a diagram of a solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 configured to couple memory card 202 to a host (e.g., host 108 in FIG. 1). In another example as shown in FIG. 2B, memory controller 106 and multiple memory devices 104 may be integrated into an SSD 206. SSD 206 can further include an SSD connector 208 configured to couple SSD 206 to a host (e.g., host 108 in FIG. 1). In some implementations, the storage capacity and/or the operation speed of SSD 206 is greater than those of memory card 202.

Figure 3:
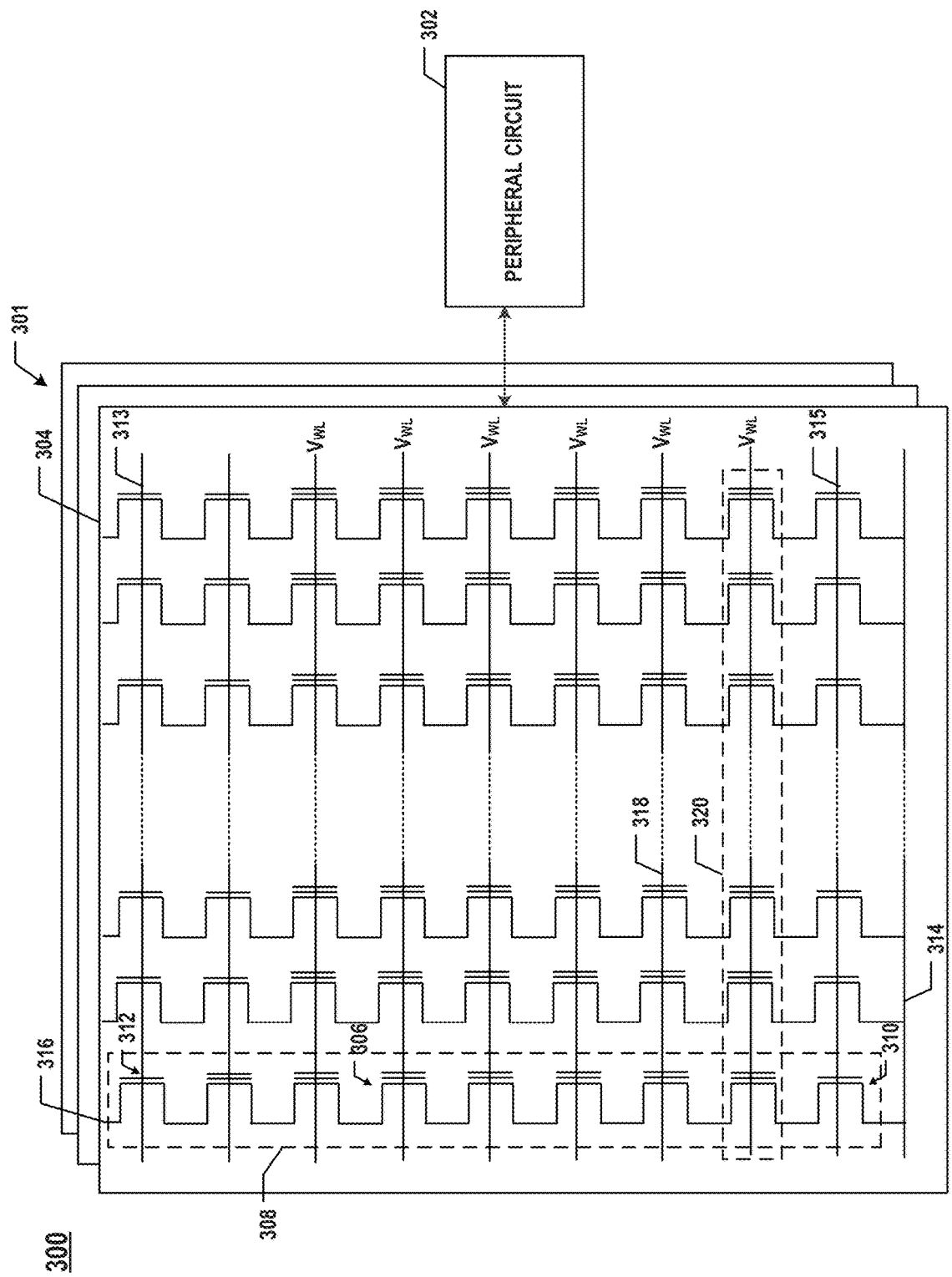
FIG. 3 illustrates a schematic diagram of a memory device including peripheral circuits, according to some aspects of the present disclosure.

FIG. 3 illustrates a schematic circuit diagram of an exemplary memory device 300 including peripheral circuits 302, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can also include an SSG transistor 310 at its source end and a DSG transistor 312 at its drain end. SSG transistor 310 and DSG transistor 312 can be configured to activate select NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. The drain of each NAND memory string 308 is coupled to a respective bit line 316 from which data can be read or written via an output bus (not shown), according to some implementations. In some implementations, each NAND memory string 308 is configured to be selected or unselected by applying a DSG select voltage or a DSG unselect voltage to the gate of respective DSG transistor 312 through one or more DSG lines 313 and/or by applying an SSG select voltage or an SSG unselect voltage to the gate of respective SSG transistor 310 through one or more SSG lines 315. NAND memory string 308 can thus become a select NAND memory string or an unselect NAND memory string.

As shown in FIG. 3, NAND memory strings 308 can be organized into multiple blocks 304, each of which can have a common source (ACS) line 314, e.g., coupled to an ACS. In some implementations, each block 304 is the basic data unit for erase operations, i.e., all memory cells 306 on the same block 304 are erased at the same time. To erase memory cells 306 in a select block 304, source lines 314 coupled to select block 304 as well as unselect blocks 304 in the same plane as select block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program and read operations. The size of one page 320 in bits can relate to the number of NAND memory strings 308 coupled by word line 318 in one block 304. Each word line 318 can include a plurality of control gates (gate electrodes) at each memory cell 306 on respective page 320 and a gate line coupling the control gates.

Figure 4A:
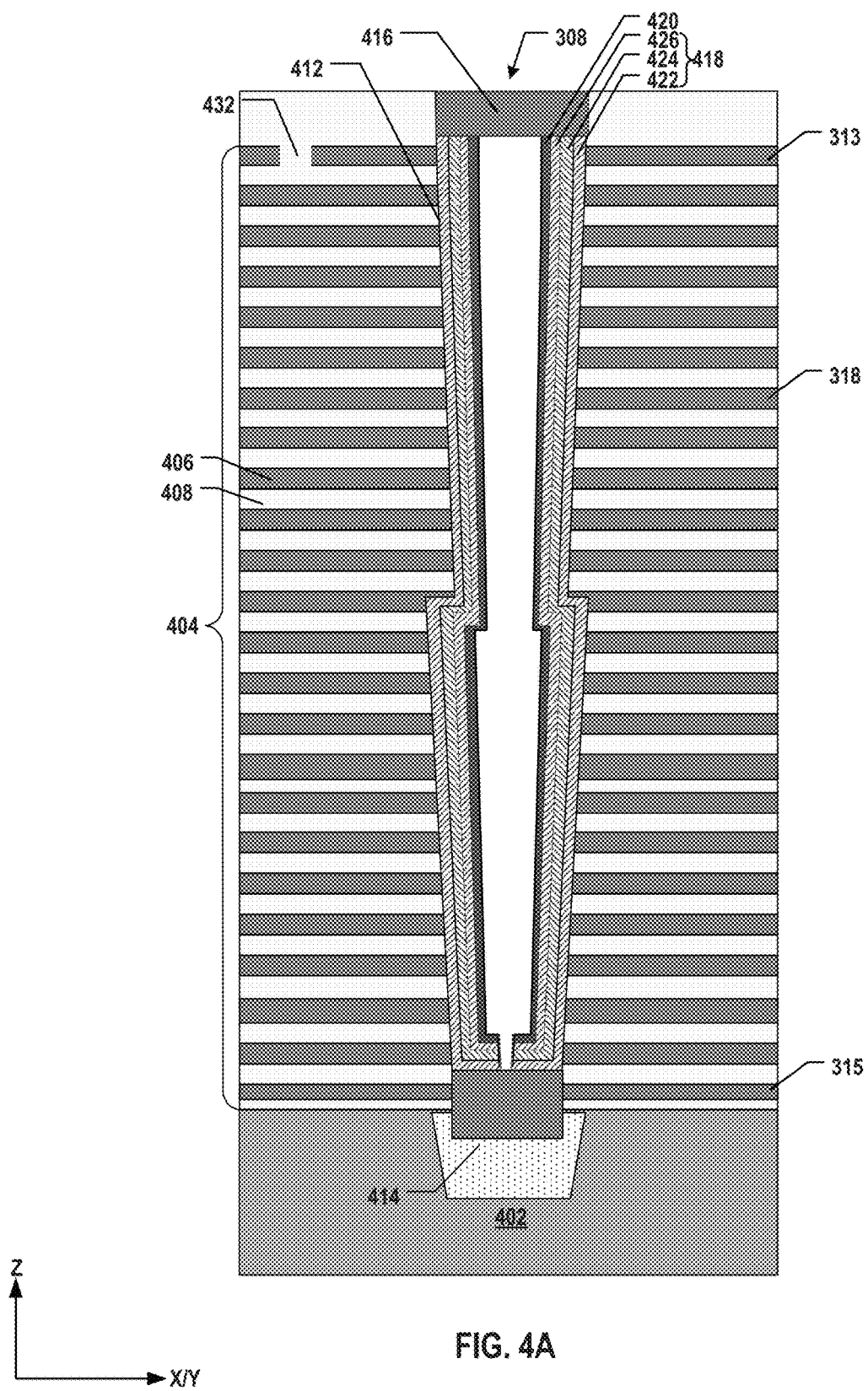
FIGS. 4A and 4B illustrate a side view and a plan view of cross-sections of a memory cell array including a NAND memory string, respectively, according to some aspects of the present disclosure.
Figure 4B:
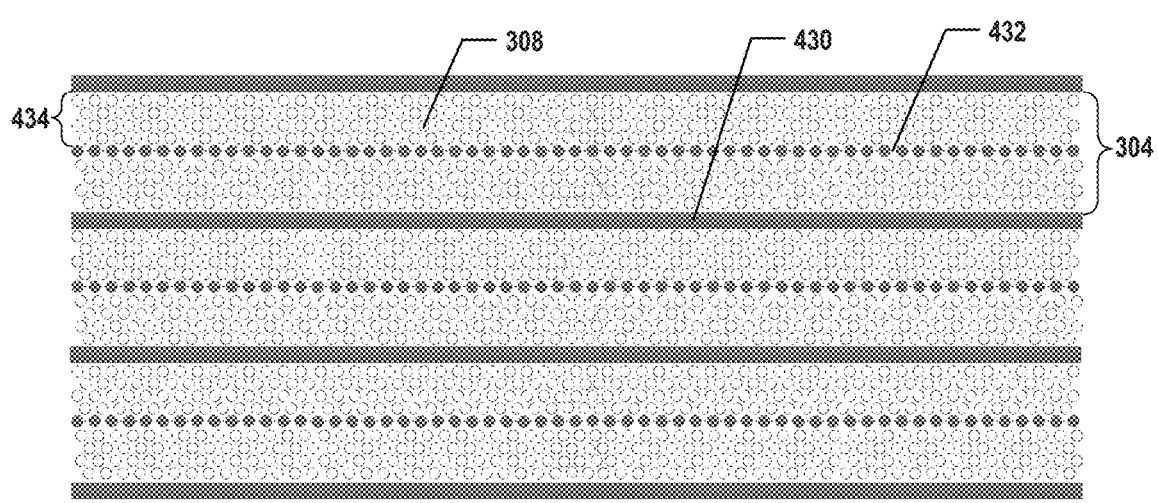
Figure 4B:

FIGS. 4A and 4B illustrate a side view and a plan view of cross-sections of an exemplary memory cell array 301 including NAND memory strings 308, respectively, according to some aspects of the present disclosure. As shown in FIG. 4A, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4A to further illustrate the spatial relationship of the components in a memory device. Substrate 402 includes two lateral surfaces extending laterally in the x-y plane: a top surface on the front side of the wafer on which the memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the memory device is determined relative to substrate 402 of the memory device in the z-direction (the vertical direction perpendicular to the x-y plane) when substrate 402 is positioned in the lowest plane of the memory device in the z-direction. The same notion for describing the spatial relationships is applied throughout the present disclosure.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include the control gates of memory cells 306, the gates of DSG transistors 312, or the gates of SSG transistors 310, and can extend laterally as DSG line 313 in the upper portion of memory stack 404, SSG line 315 in the lower portion of memory stack 404, or word line 318 between DSG line 313 and SSG line 315. It is understood that although one SSG line 315 and one DSG line 313 are shown in FIG. 4A, the number of SSG lines 315 and the number of DSG lines 313 (as well as the numbers of SSG transistors 310 and DSG transistors 312 coupled to the SSG lines 315 and DSG lines 313, respectively) may vary in other examples.

As shown in FIG. 4A, NAND memory string 308 includes a channel structure 412 extending vertically through memory stack 404. In some implementations, channel structure 412 includes a channel opening filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4A, a well 414 (e.g., a P-well and/or an N-well) is formed in substrate 402, and the source of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308, e.g., as part of the drain of NAND memory string 308. It is understood that the structure of channel structure 412 depicted in FIG. 4A is for illustrative purposes only and may vary in other examples.

As shown in the plan view of FIG. 4B, NAND memory strings 308 of memory cell array 301 can be arranged into blocks 304 by slit structures 430 (e.g., gate line slits (GLSs)), which electrically separate word lines 318 between adjacent blocks 304, such that each block 304 can be individually controlled in read, program, and erase operations. In one example, each slit structure 430 may extend along the x-direction (e.g., the word line direction), and multiple blocks 304 may be arranged along the y-direction (e.g., the bit line direction). In some implementations, each block 304 can be further divided into smaller areas 434 by DSG cuts 432 (a.k.a., top select gate (TSG) cuts), which electrically separate DSG lines 313 between adjacent areas 434, such that DSG lines 313 in different areas 434 may be individually controlled in read and program operations. For example, in a program operation, one NAND memory string 308 in one area 434 may be a select NAND memory string by applying a select DSG voltage to a respective DSG line 313 to turn on the respective DSG transistor 312, while another NAND memory string 308 in another area 434 may be an unselect NAND memory string by applying an unselect DSG voltage to a respective DSG line 313 to turn off the respective DSG transistor 312.

Figure 5:
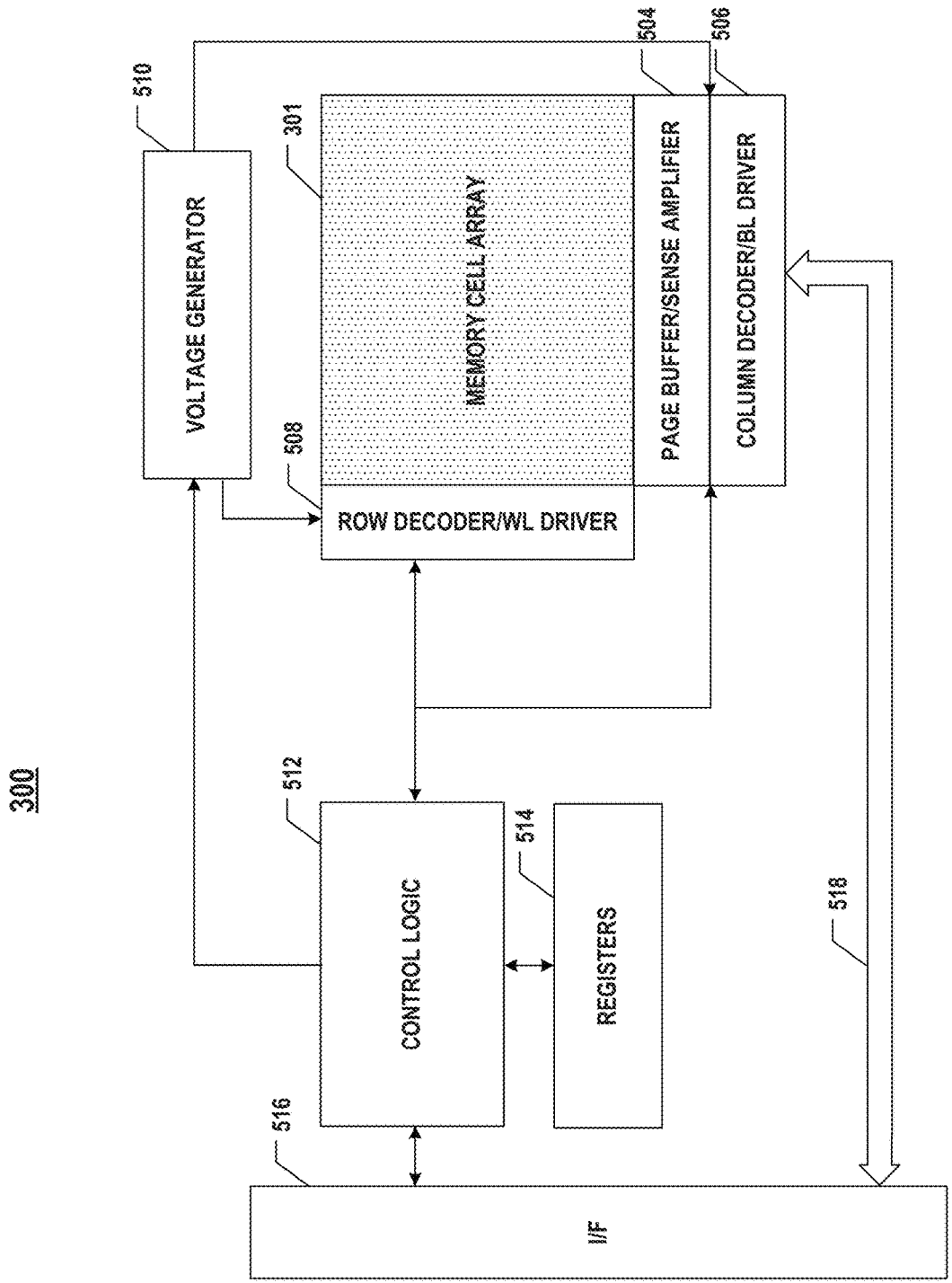
FIG. 5 illustrates a block diagram of a memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target (select) memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may sense the signals (e.g., current) from bit line 316 to verify whether the data has been properly programmed into target memory cells 306 coupled to select word lines 318. In still another example, page buffer/sense amplifier 504 may also sense the low power signals (e.g., current) from bit line 316 that represents a data bit stored in memory cell 306 and amplify the small voltage swing to recognizable logic levels in a read operation. Column decoder/bit line driver 506 can be configured to be controlled by control logic 512 and select one or more NAND memory strings 308 by applying bit line voltages generated from voltage generator 510.

Row decoder/word line driver 508 can be configured to be controlled according to the control signals by control logic 512 and select/unselect blocks 304 of memory cell array 301 and select/unselect word lines 318 of block 304. Row decoder/word line driver 508 can be further configured to drive word lines 318 using word line voltages generated from voltage generator 510. In some implementations, row decoder/word line driver 508 can also select/unselect and drive SSG lines 315, and DSG lines 313 as well using SSG voltages and DSG voltages generated from voltage generator 510.

Voltage generator 510 can be configured to be controlled by control logic 512 and generate the various word line voltages (e.g., read voltage, program voltage, pass voltage, verify voltage), SSG voltages (e.g., select/unselect voltages), DSG voltages (e.g., select/unselect voltages), bit line voltages (e.g., ground voltage), and source line voltages (e.g., ground voltage) to be supplied to memory cell array 301.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit. In some implementations, control logic 512 can receive a program command issued by a memory controller (e.g., memory controller 106 in FIG. 1) and send control signals to various peripheral circuits, such as row decoder/word line driver 508, column decoder/bit line driver 506, and voltage generator 510 to initiate the program operation on target memory cells 306 coupled to select word line 318. Consistent with the scope of the present disclosure, in a program/verify cycle of a program operation, control logic 512 can compare the initial verify voltage, which is at the beginning of one or more verify voltages used for verifying target memory cell 306 of the program operation, with a threshold verify voltage, to determine whether a pre-pulse stage needs to be included in the current program/verify cycle to reduce the HCI effect based on the comparison result.

Interface 516 can be coupled to control logic 512 and act as a control buffer to buffer and relay control commands (e.g., program command) received from a memory controller (e.g., memory controller 106 in FIG. 1) to control logic 512 and status information received from control logic 512 to the memory controller. Interface 516 can also be coupled to column decoder/bit line driver 506 via data bus 518 and act as a data input/output (I/O) interface and a data buffer to buffer and relay the data to and from memory cell array 301.

Figure 6:
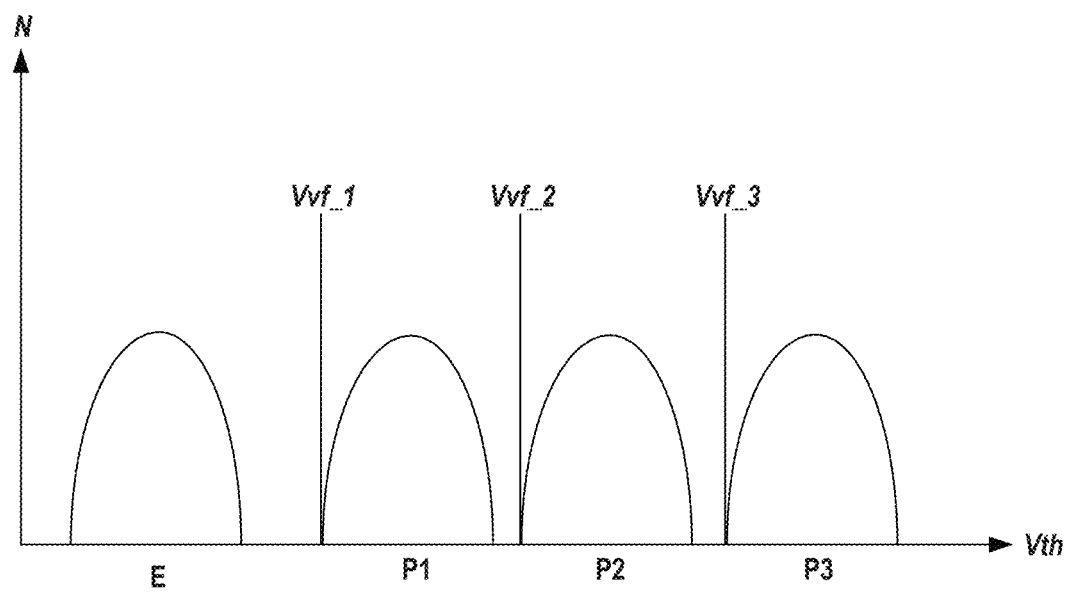
FIG. 6 illustrates an example of threshold voltage distributions of memory cells and corresponding verify voltages, according to some aspects of the present disclosure.

FIG. 6 illustrates an example of threshold voltage (Vth) distributions of memory cells 306 and corresponding verify voltages (Vvf), according to some aspects of the present disclosure. Each memory cell 306 that passes the verification in a program/verify cycle can become program-inhibited and store a piece of N-bits data in one of $2^N$ levels, where N is an integer greater than 1 (e.g., N=2 for MLCs, N=3 for TLCs, N=4 for QLCs, etc.). Each level (a.k.a., state) can correspond to one of $2^N$ threshold voltage (Vth) ranges of memory cells 306. Taking MLCs, where N=2, for example, as shown in FIG. 6, memory cell 306 may be programmed into one of the 4 levels, including one level of the erased state (E) and 3 levels of the programmed states (P1, P2, and P3). Each level may correspond to a respective threshold voltage (Vth) range of memory cells 306. For example, the level corresponding to the lowest threshold voltage range (e.g., E, the left-most threshold voltage distribution in FIG. 6) may be considered as level 0, the level corresponding to the second-lowest threshold voltage range (e.g., P1, the second left-most threshold voltage distribution in FIG. 6) may be considered as level 1, and so until level 3 corresponding to the highest threshold voltage range (e.g., P3, the right-most threshold voltage distribution in FIG. 6).

Thus, to verify the $2^N$ possible levels of memory cells 306 in a program/verify cycle, $2^N-1$ verify voltages can be used, such that each verify voltage can be set between two adjacent levels. Still taking MLCs, where N=2, for example, as shown in FIG. 6, 3 verify voltages (Vvf_1, Vvf_2, and Vvf_3) may be used to verify 4 possible levels. For example, Vvf_1 between the erase state (E) and the first program state (P1) may be used to verify whether memory cell 306 has been successfully programmed from E to P1, Vvf_2 between the first program state (P1) and the second program state (P2) may be used to verify whether memory cell 306 has been successfully programmed from P1 to P2, and Vvf_3 between the second program state (P2) and the third program state (P3) may be used to verify whether memory cell 306 has been successfully programmed from P2 to P3. As shown in FIG. 6, Vvf_1<Vvf_2<Vvf_3.

Figure 7:
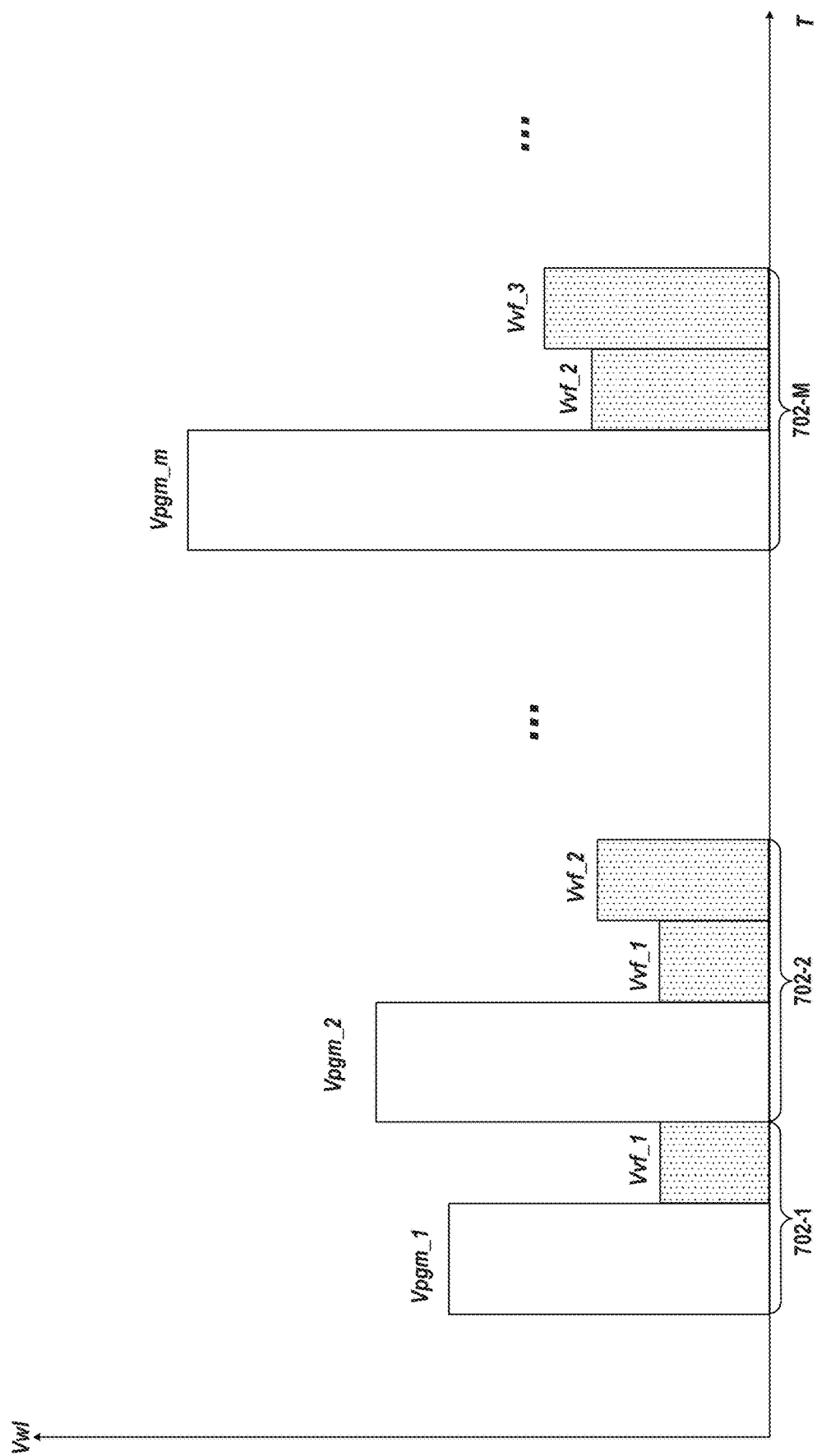
FIG. 7 illustrates program/verify cycles in a program operation, according to some aspects of the present disclosure.

FIG. 7 illustrates program/verify cycles in a program operation, according to some aspects of the present disclosure. As shown in FIG. 7, to program target memory cells 306 coupled to a select word line 318, one or more program/verify cycles 702 can be included in the program operation in sequence. During the program operation, in any program/verify cycle, a program voltage (e.g., Vpgm_1, Vpgm_2, ..., Vpgm_m, ...) is applied to select word line 318 to program target memory cells 306 coupled to select word line 318 in a program stage, followed by applying one or more verify voltages (e.g., Vvf_1, Vvf_2, and/or Vvf_3 for an MLC target memory cell) to check whether the threshold voltage of each programmed target memory cell 306 reaches the verify voltage (i.e., verified/successfully programmed) in a verify stage. In some implementations, program voltages (e.g., e.g., Vpgm_1, Vpgm_2, ..., Vpgm_m) are applied following an incremental step pulse programming (ISPP) scheme, which is commonly used in operation operations of memory devices, such as NAND Flash memory devices, to achieve fast program performance under process and environmental variations while keeping a tight programmed cell threshold voltage distribution. The ISPP scheme can program target memory cells 306 in multiple program/verify cycles while gradually increasing the word line bias voltage (program voltages) on a step-voltage basis. The magnitude of this "step" (e.g., the increase in the magnitude of each program pulse relative to the immediately previous program pulse) is referred to herein as the incremental voltage (a.k.a. pulse step height). It is understood that in some examples, a non-ISPP scheme may be applied in multiple program/verify cycles of a program operation. It is also understood that in some examples, the program operation may include a single program/verify cycle, as opposed to multiple program/verify cycles.

If one or more memory cells 306 (verification-failed memory cells) fail to pass the verification, i.e., their threshold voltages are below the verify voltage, a subsequent program/verify cycle is then applied on the verification-failed memory cells with an increased program voltage. Each NAND memory string 308 including a verification-failed memory cell may be referred to herein as a select NAND memory string in the subsequent program/verify cycle since such a NAND memory string 308 needs to be selected again in the subsequent program/verify cycle. The memory cells that pass the verification (verification-passed memory cells), i.e., their threshold voltages are equal to or above the verify voltage, become program-inhibited in the subsequent program/verify cycle(s) of the program operation. Each NAND memory string 308 including a verification-passed memory cell may be referred to herein as an unselect NAND memory string in the subsequent program/verify cycle since such a NAND memory string 308 no longer needs to be selected again in the subsequent program/verify cycle.

Since memory cells 306 are usually programmed from the lowest level (e.g., E) to the highest level (e.g., P3 in FIG. 6), if multiple program/verify cycles are used with gradually increased program voltages, not all the levels need to be verified in each program/verify cycle, according to some implementations. In other words, in some implementations, not all the verify voltages need to be applied in each program/verify cycle. Instead, low verify voltage(s) can be applied in early program/verify cycle(s) to verify the low level(s), while high verify voltage(s) can be applied in late program/verify cycle(s) to verify the high level(s). For example, as shown in FIG. 7, still taking MLC memory cells as an example, in the first program/verify cycle 702-1, only the first verify voltage Vvf_1 (i.e., the lowest one) may be applied to verify whether target memory cells 306 have been programmed to the first program state (P1). In the second program/verify cycle 702-2, Vvf_1 and the second verify voltage Vvf_2 may be sequentially applied to verify whether some target memory cells 306 have been programmed to P1 and some target memory cells 306 have been programmed to the second program state (P2). In the Mth program/verify cycle 702-M, Vvf_1 may no longer be applied, while Vvf_2 and the third verify voltage Vvf_3 (i.e., the highest one) may be sequentially applied to verify whether some target memory cells 306 have been programmed to P2 and some target memory cells 306 have been programmed to the third program state (P3). It is understood that in some examples, all the verify voltages may be applied in a program/verify cycle 702.

Figure 8:
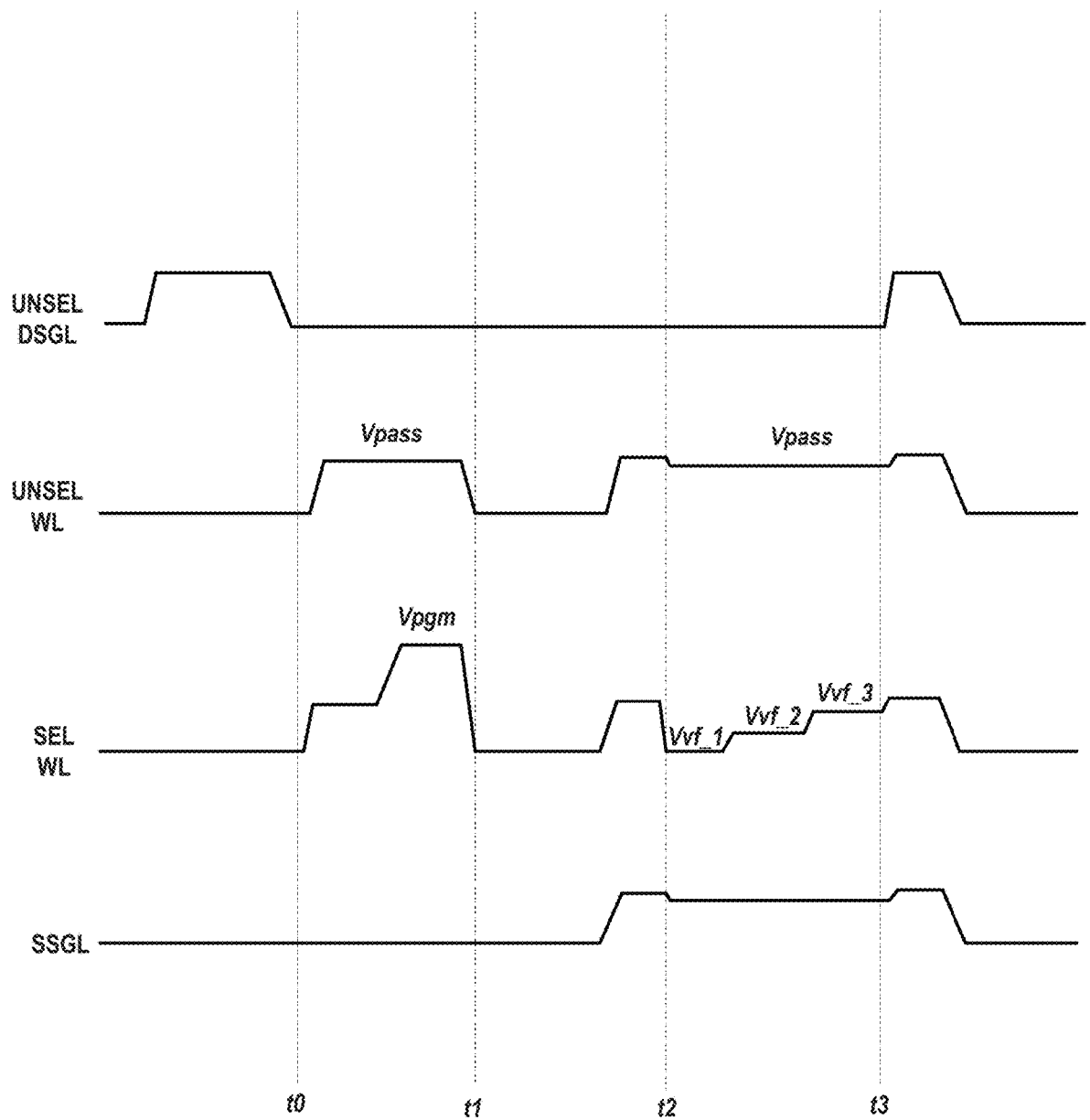
FIG. 8 illustrates a waveform diagram of a program/verify cycle in a program operation.
Figure 9A:
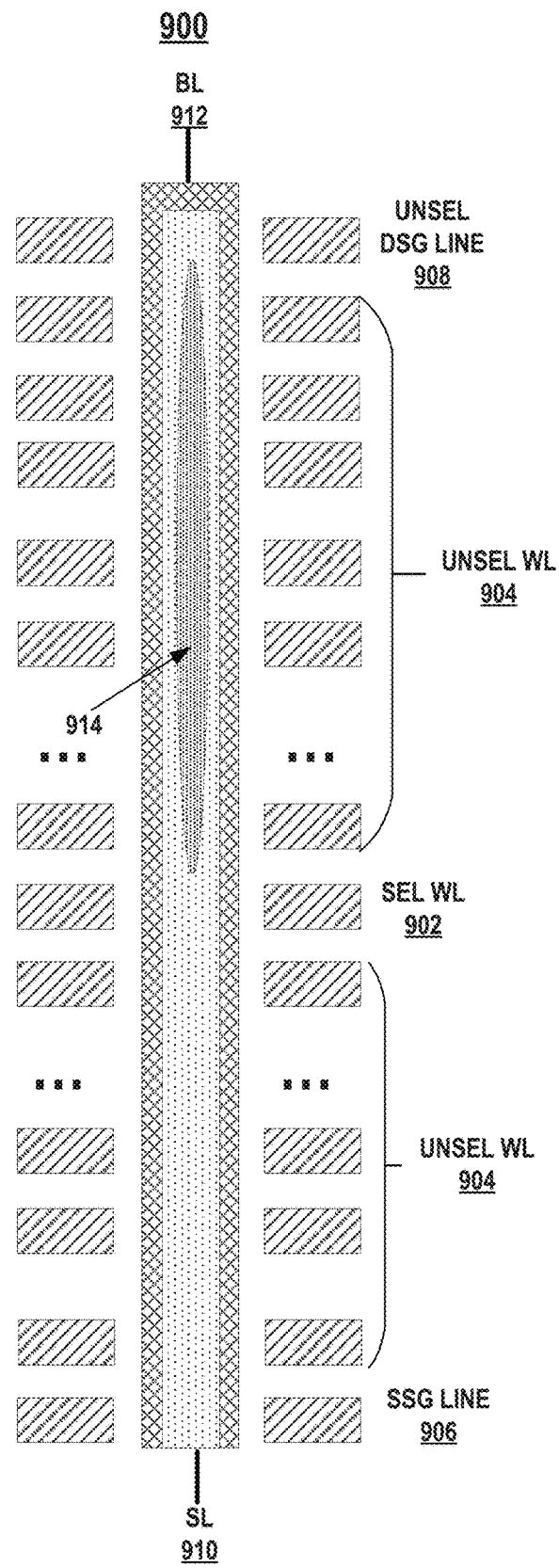
FIGS. 9A and 9B illustrate a NAND memory string and the channel potential thereof, respectively, during the program/verify cycle in FIG. 8.
Figure 9B:
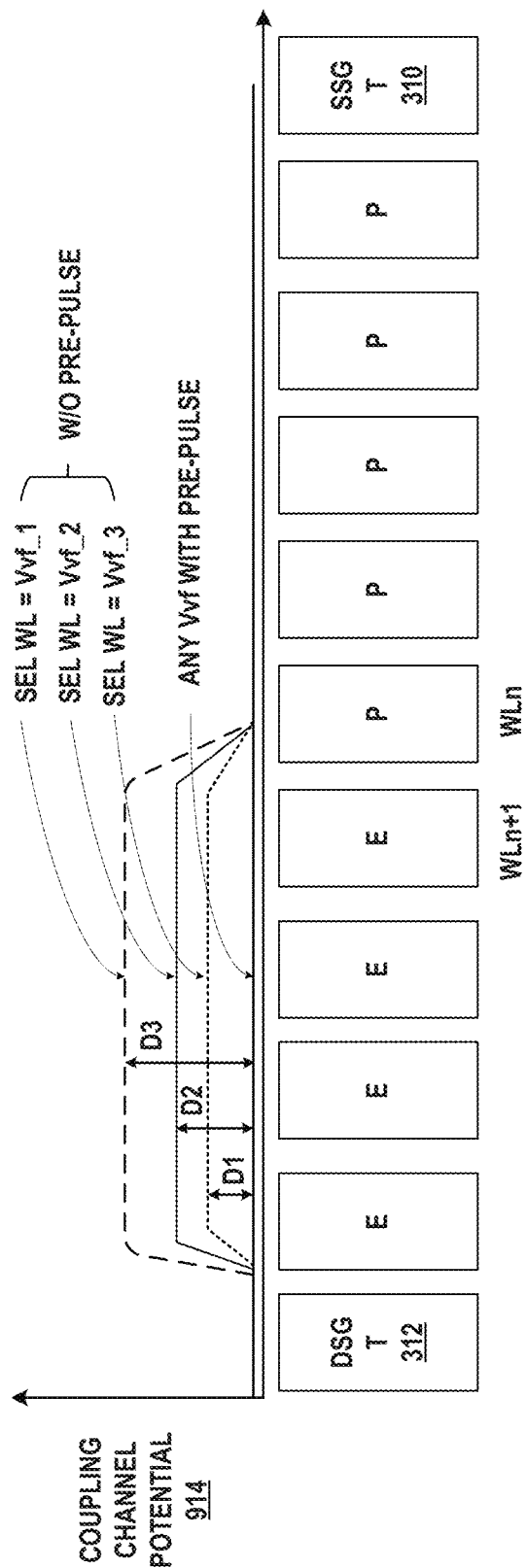

FIG. 8 illustrates a waveform diagram of a program/verify cycle in a program operation. FIGS. 9A and 9B illustrate an unselect NAND memory string 900 and the channel potential thereof, respectively, during the program/verify cycle in FIG. 8. As shown in FIGS. 8 and 9A, during the program stage (between time t0 and time t1) of the program/verify cycle, a program voltage (Vpgm) for programming target memory cells may be first ramped up and applied to select word line 902 (SEL WL), and then discharged and ramped down. At the same time, a pass voltage (Vpass) may be first ramped up and applied to each unselect word line 904 (UNSEL WL), and then discharged and ramped down. The pass voltage may be lower than the program voltage. An unselect voltage (e.g., a ground voltage) may be applied to both SSG line 906 (SSGL) and unselect DSG line 908 (UNSEL DSGL) to turn off SSG transistor 310 and DSG transistor 312 in unselect NAND memory string 900 during the program stage (between t0 and t1) to inhibit the programming of the verification-passed memory cell in unselect NAND memory string 900.

As shown in FIGS. 8 and 9A, during the verify stage (between time t2 and time t3) after the program stage, one or more verify voltages (e.g., Vvf_1, Vvf_2, and Vvf_3) may be sequentially applied to select word line 902, while the pass voltage may be applied to each unselect word line 904. For unselect NAND memory string 900, although SSG transistor 310 may be turned on as a select voltage may be applied to SSG line 906, since DSG transistor 312 may still be turned off due to an unselect voltage (e.g., the ground voltage) applied to unselect DSG line 908, the verification-passed memory cell in unselect NAND memory string 900 may remain inhibited during the verify stage.

As shown in FIGS. 8 and 9A, during the verify stage (between t2 and t3), for unselected NAND memory string 900, DSG transistor 312 is turned off. Thus, when the verify voltage applied to select word line 902 is lower than the threshold voltage of target memory cell 306 coupled to select word line 902, target memory cell 306 is turned off, and part of the channel of unselected NAND memory string 900 that is between unselect DSG line 908 and select word line 902 is in a floating state. The pass voltage applied to each unselect word line 904 between unselect DSG line 908 and select word line 902 generates a coupling channel potential 914 in that part of the channel due to the channel coupling effect. On the other hand, since SSG transistor 310 at the other end of unselected NAND memory string 900 is turned on during the verify stage, the rest of the channel that is between select word line 902 and SSG line 906 is coupled to a source line 910 (SL), rather than floating. That is, coupling channel potential 914 does not extend further beyond select word line 902, and the channel potential between select word line 902 and SSG line 906 is zero when source line 910 is grounded.

Also, the pass voltage applied to unselect word line 904 can be higher than the verify voltages applied to select word line 902 during the verify stage (between t2 and t3). As a result, during the verify stage, there is a channel potential difference between select word line 902 (WLn) and its adjacent unselect word line 904 (WLn+1) toward DSG transistor 312, which may cause interference to the programming of target memory cell 306 due to HCI, as shown in FIG. 9B. Moreover, it is observed that for the same pass voltage, the lower the verify voltage is (e.g., Vvf_1 at the beginning of the verify stage), the higher coupling channel potential 914 will be, thereby causing a higher channel potential difference and more severe interference. It is further observed that during the verify stage, coupling channel potential 914 gradually decreases as time goes by due to channel leakage. Thus, the HCI and its interference take place mainly at the beginning of the verify stage, i.e., when the initial verify voltage (e.g., Vvf_1 in FIG. 8) is applied to select word line 902.

Figure 10:
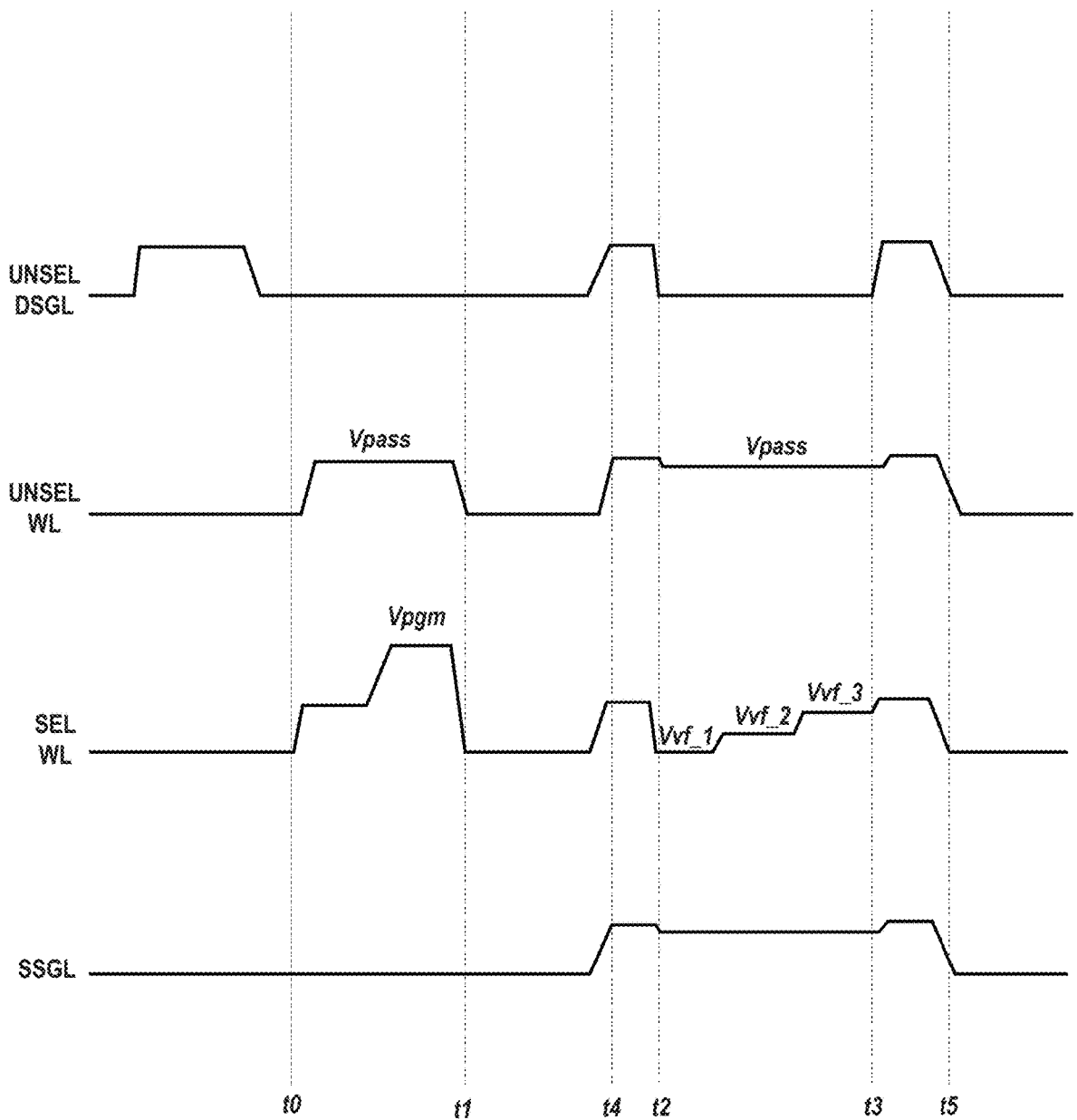
FIG. 10 illustrates a waveform diagram of a program/verify cycle in a program operation, according to some aspects of the present disclosure.

In some implementations, to resolve the HCI and its interference due to coupling channel potential 914, a pre-pulse stage is added between the program stage and the verify stage in a program/verify cycle to avoid coupling channel potential 914 before applying the initial verify voltage. For example, different from the waveform in FIG. 8, as shown in FIG. 10, a select voltage may be applied to unselect DSG line 908 in a pre-pulse stage (between time t4 and time t2) to turn on DSG transistor 312 in unselect NAND memory string 900 in an interval between the program stage (between t0 and t1) and the verify stage (between t2 and t3). As shown in FIG. 10, during the pre-pulse stage, a word line voltage that is above the threshold voltage of target memory cell 306 can also be applied to select word line 902 to turn on target memory cell 306 coupled to select word line 902. As a result, the part of the channel that is between select word line 902 and unselect DSG line 908 becomes conducting (e.g., coupled to a bit line 912 (BL)), rather than floating, thereby eliminating coupling channel potential 914 and the resulting HCI and its interference, according to some implementations. It is understood that the pre-pulse stage may not last through the entire period between the program stage and the verify stage (e.g., between t1 and t2), but rather an interval (e.g., between time t4 and time t2) thereof, as shown in FIG. 10. The extra pre-pulse stage, however, may increase the program time and reduce the program speed, in particular, when it is blindly added into each program/verify cycle. In some implementations, a pre-cut off stage (between time t3 and time t5) similar to the pre-pulse stage is added after the verify stage to further eliminate any coupling channel potential generated during the verify stage. During the pre-cut off stage, a DSG select voltage may be applied to unselect DSG line 908 to turn on DSG transistor 312 of unselected NAND memory string 900.

Figure 11:
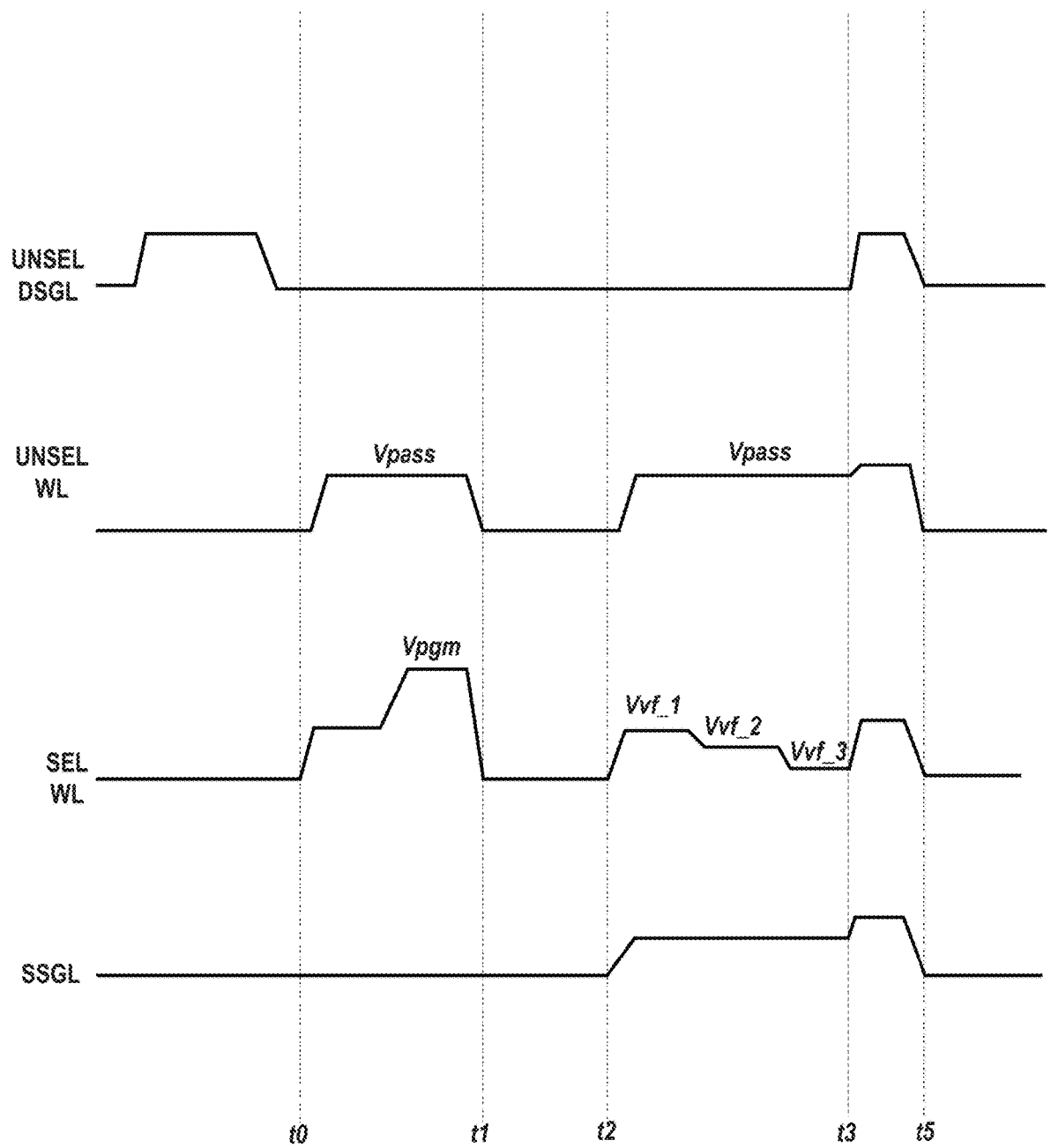
FIG. 11 illustrates a waveform diagram of another program/verify cycle in a program operation, according to some aspects of the present disclosure.

FIG. 11 illustrates a waveform diagram of another program/verify cycle in a program operation, according to some aspects of the present disclosure. Compared with the waveform shown in FIG. 10, the pre-pulse stage (between t4 and t2) is skipped from the waveform in FIG. 11. For example, an unselect voltage (e.g., the ground voltage) may be applied to unselect DSG line 908 to turn off DSG transistor 312 in unselect NAND memory string 900 between the program stage and the verify stage (e.g., between t1 and t2). As shown in FIG. 9, between the program stage and the verify stage (e.g., between t1 and t2), a word line voltage that is below the threshold voltage of target memory cell 306 (e.g., the ground voltage) may also be applied to select word line 902 to turn off target memory cell 306 coupled to select word line 902. That is, neither DSG transistor 312 nor target memory cell 306 coupled to select word line 902 needs to be turned on between the program stage and the verify stage (e.g., between t1 and t2) in the program/verify cycle as the pre-pulse stage is skipped, according to some implementations. It is understood that DSG transistor 312 in unselect NAND memory string 900 may remain turned off (i.e., be kept in the off state) through the entire period between the program stage and the verify stage (e.g., between t1 and t2) to skip the pre-pulse stage, as shown in FIG. 11. It is further understood that DSG transistor 312 in unselect NAND memory string 900 may be changed from the on state to the off state or kept in the off state between the program stage and the verify stage, both of which may be considered as being turned off in the present disclosure. Similar to the waveform in FIG. 10, in FIG. 11, a pre-cut off stage (between time t3 and time t5) is added after the verify stage to further eliminate any coupling channel potential generated during the verify stage, according to some implementations. During the pre-cut off stage, a DSG select voltage may be applied to unselect DSG line 908 to turn on DSG transistor 312 of unselected NAND memory string 900.

In some implementations, the initial verify voltage (e.g., Vvf_1) is the maximum voltage of all verify voltages (e.g., Vvf_1, Vvf_2, and Vvf_3). For example, the verify voltages may decrease in turn during the verify stage, e.g., Vvf_1>Vvf_2>Vvf_3, as shown in FIG. 11. It is understood that in some examples, the initial verify voltage may be the maximum voltage, while the rest of the verify voltages may not decrease in turn during the verify stage. Nevertheless, by setting the initial verify voltage to be the maximum voltage, the impact on channel potential difference from verify voltages can be minimized since the impact mainly occurs at the beginning of the verify stage as described above. It is further understood that in some examples, the initial verify voltage may not be the maximum voltage of all verify voltages during the verify stage.

FIGS. 10 and 11 illustrate two examples of program/verify cycles with and without a pre-pulse stage, respectively. Consistent with the scope of the present disclosure, program/verify cycles with and without a pre-pulse stage can be dynamically implemented in a program operation to balance the need of avoiding the HCI interference and the need of saving program time, as opposed to blindly adding a pre-pulse stage into every single program/verify cycle. In some implementations, a threshold verify voltage can be used as the reference to determine whether the initial verify voltage in a program/verify cycle is high enough such that the channel potential difference can be ignored as it would not cause HCI interference. In other words, the pre-pulse stage can be added to a program/verify cycle (e.g., as shown in FIG. 10) only when the initial verify voltage is not higher than the threshold voltage in order to avoid the interference from HCI. Otherwise, the pre-pulse stage can be skipped from the program/verify cycle (e.g., as shown in FIG. 11) to reduce the program time and increase the program speed.

As shown in FIGS. 3, 4A, 5, and 9, peripheral circuits 302 can be configured to program a target memory cell 306 in a select NAND memory string 308. In some implementations, control logic 512 of peripheral circuits 302 receives a program command from a memory controller (e.g., memory controller 106) through interface 516, and in response, sends control signals to at least row decoder/word line driver 508, column decoder/bit line driver 506, and voltage generator 510 to initiate the program operation on target memory cells 306 coupled to select word line 318. Depending on the number of states to be programmed (i.e., the number of bits in each memory cell 306, e.g., SLC, MLC, TLC, QLC, etc.), one or more program passes can be performed. As shown in FIG. 7, in each program pass, one or more program/verify cycles (e.g., 702-1, 702-2, . . . , 702-M, . . . ) can be included in the program operation in sequence. During the program stage of a program/verify cycle, a program voltage (i.e., a voltage pulse signal, e.g., Vpgm in FIGS. 10 and 11) can be applied to select word line 318 by word line driver 508 to program target memory cells 306 in select NAND memory strings 308. For an unselect NAND memory string (e.g., unselect NAND memory string 900 in FIG. 9), peripheral circuits 302 can turn off DSG transistor 312 thereof when programming target memory cell 306. For example, row decoder/word line driver 508 may apply an unselect voltage (e.g., the ground voltage) to unselect DSG line 908 when programming target memory cells 306. It is understood that row decoder/word line driver 508 and column decoder/bit line driver 506 may apply signals to unselect word lines 904 and SSG line 906, for example, as shown by the waveforms in FIGS. 10 and 11, and any other suitable signals to other lines to program target memory cells 306 in select NAND memory strings 308 while inhibiting verification-passed memory cells in unselect NAND memory strings 900.

As shown in FIGS. 3, 4A, 5, and 9, peripheral circuits 302 can be also configured to, after programming target memory cell 306, verify target memory cell 306 using one or more verify voltages including an initial verify voltage. In some implementations, in each program/verify cycle, after programming target memory cell 306, control logic 512 of peripheral circuits 302 sends control signals to at least row decoder/word line driver 508, column decoder/bit line driver 506, voltage generator 510, and page buffer/sense amplifier 504. During the verify stage of a program/verify cycle, one or more verify voltages (i.e., a voltage signal with one or more pulses, e.g., Vvf_1, Vvf_2, and Vvf_3 in FIGS. 10 and 11) can be sequentially applied, starting from the initial verify voltage (e.g., Vvf_1), to select word line 318 by word line driver 508 to verify target memory cells 306 in select NAND memory strings 308. For an unselect NAND memory string (e.g., unselect NAND memory string 900 in FIG. 9), peripheral circuits 302 can turn off DSG transistor 312 thereof when verifying target memory cell 306. For example, row decoder/word line driver 508 may apply an unselect voltage (e.g., the ground voltage) to unselect DSG line 908 when verifying target memory cells 306. When verifying target memory cells 306, row decoder/word line driver 508 may also apply a pass voltage (e.g., higher than the initial verify voltage) to each unselect word line 904 to turn on respective memory cells 306 coupled thereto. It is understood that row decoder/word line driver 508 and column decoder/bit line driver 506 may apply a signal to SSG line 906, for example, as shown by the waveforms in FIGS. 10 and 11, and any other suitable signals to other lines to verify target memory cells 306 in select NAND memory strings 308 while inhibiting verification-passed memory cells in unselect NAND memory strings 900.

Figure 12:
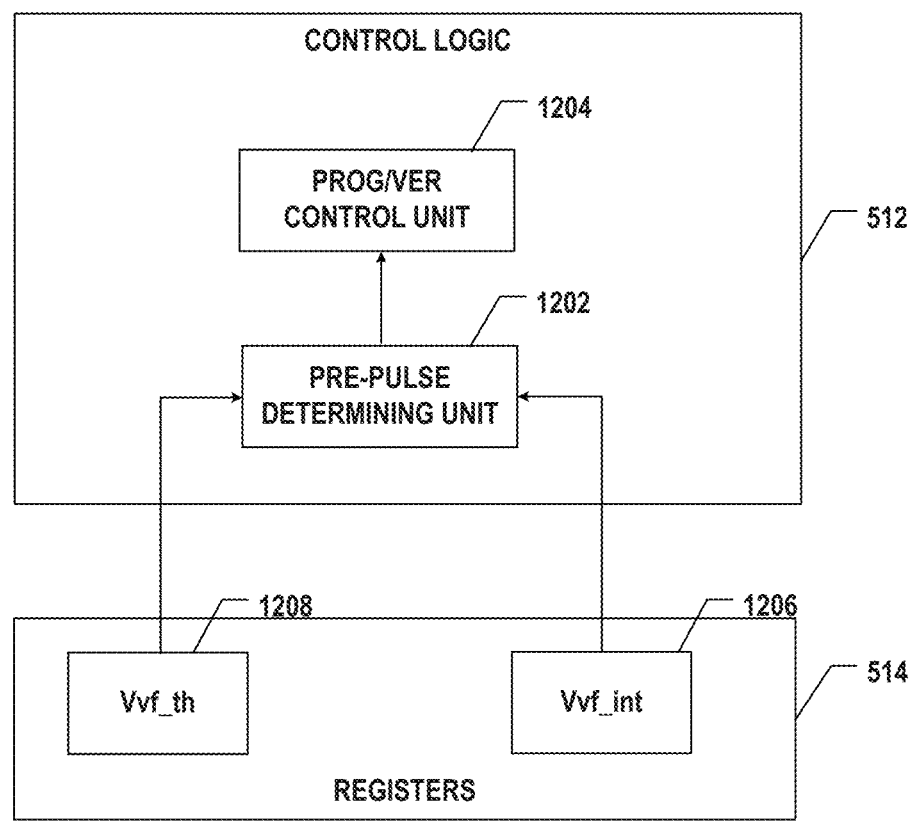
FIG. 12 illustrates a detailed block diagram of control logic and a register of the memory device in FIG. 3, according to some aspects of the present disclosure.

As shown in FIGS. 3, 4A, 5, and 9, control logic 512 of peripheral circuits 302 can be further configured to compare the initial verify voltage with a threshold verify voltage. For example, as shown in FIG. 12, control logic 512 may include a pre-pulse determining unit 1202 configured to retrieve the initial verify voltage 1206 (Vvf_int) of each program/verify cycle as well as a threshold verify voltage 1208 (Vvf_th) from register 514. In one example, control logic 512 may include a processor (e.g., a microcontroller unit (MCU)) and a memory (e.g., random-access memory (RAM)), and pre-pulse determining unit 1202 may be implemented as a firmware module stored in the RAM and executed by the MCU. In another example, pre-pulse determining unit 1202 may be implemented as application-specific integrated circuits (ASICs), including a digital circuit, an analog circuit, and/or a mixed-signal circuit.

As described above with respect to FIG. 7, the verify voltage(s) used in different program/verify cycles may vary. In some implementations, the verify voltage(s), including initial verify voltage 1206, to be used by a program/verify cycle are stored in register 514, such that pre-pulse determining unit 1202 can obtain the value of initial verify voltage 1206 of the ongoing program/verify cycle prior to the verify stage. It is understood that pre-pulse determining unit 1202 may obtain the value of initial verify voltage 1206 from any other suitable means, not limited to register 514. Threshold verify voltage 1208 can be used as the reference to be compared with initial verify voltage 1206 to determine whether to add the pre-pulse stage to the ongoing program/verify cycle. Threshold verify voltage 1208 can be determined, either preset or on-the-fly, based on various factors. In some implementations, threshold verify voltage 1208 is determined based, at least in part, on the pass voltage applied to unselect word lines 904 during the verify stage since the difference between the pass voltage and initial verify voltage 1206 affects the channel potential difference. For example, the pass voltage (Vpass) may be higher than initial verify voltage 1206 (Vvf_int), and threshold verify voltage 1208 (Vvf_th) may be set as Vvf_th=Vpass−Δ, where Δ may be determined and/or adjusted based on the design and characteristics of different 3D NAND memory devices. In one example, Δ is equal to about 3 V. In some implementations, threshold verify voltage 1208 is determined based, at least in part, on the sequence number of the program/verify cycle among a plurality of program/verify cycles. It is observed that the channel potential difference and the resulting HCI interference are also affected by the number of program/verify cycles performed in program operations. Thus, threshold verify voltage 1208 can be adjusted based on the number of program/verify cycles that have been performed, i.e., the sequence number of the ongoing program/verify cycle (e.g., 1st cycle, 2nd cycle, etc.).

As shown in FIGS. 3, 4A, 5, and 9, peripheral circuits 302 can be further configured to compare the initial verify voltage with a threshold verify voltage so as to obtain a comparing result, and control, at least based on the comparing result, DSG transistor 312 in unselect memory string 900 between programming and verifying the targe memory cell. In some implementations, to control DSG transistor 312, in response to the initial verify voltage being higher than the threshold verify voltage, peripheral circuits 302 can be configured to turn off DSG transistor 312 in unselect NAND memory string 900 between programming and verifying target memory cell 306. That is, peripheral circuits 302 can skip the pre-pulse stage from the ongoing program/verify cycle when it is determined that the initial verify voltage is high enough (with respect to the threshold verify voltage) to warrant the skip of the pre-pulse stage without causing HCI interference. For example, as shown in FIG. 12, control logic 512 may include a program/verify (prog/ver) control unit 1204 configured to, in response to receiving an indication from pre-pulse determining unit 1202 that initial verify voltage 1206 is higher than threshold verify voltage 1208, send control signals to row decoder/word line driver 508 to cause row decoder/word line driver 508 to apply an unselect voltage (e.g., the ground voltage) to unselect DSG line 908 to turn off DSG transistor 312 in unselect NAND memory string 900 between the program stage and the verify stage (e.g., as shown in FIG. 11). In some implementations, the control signals sent by program/verify control unit 1204 further cause row decoder/word line driver 508 to apply an unselect voltage (e.g., the ground voltage) to select word line 902 to turn off target memory cell 306 in unselect NAND memory string 900 as well between the program stage and the verify stage (e.g., as shown in FIG. 11). In one example, program/verify control unit 1204 may be implemented as a firmware module stored in the RAM and executed by the MCU. In another example, program/verify control unit 1204 may be implemented as ASICs, including a digital circuit, an analog circuit, and/or a mixed-signal circuit.

In some implementations, to control DSG transistor 312, peripheral circuits 302 can be further configured to in response to the initial verify voltage being equal to or lower than the threshold verify voltage, turn on DSG transistor 312 in unselect NAND memory string 900 in an interval between programming and verifying target memory cell 306. That is, peripheral circuits 302 can add the pre-pulse stage into the ongoing program/verify cycle when it is determined that the initial verify voltage is not high enough (with respect to the threshold verify voltage) to warrant the skip of the pre-pulse stage without causing HCI interference. For example, as shown in FIG. 12 program/verify control unit 1204 may be further configured to, in response to receiving an indication from pre-pulse determining unit 1202 that initial verify voltage 1206 is not higher than threshold verify voltage 1208, send control signals to row decoder/word line driver 508 to cause row decoder/word line driver 508 to apply a select voltage (e.g., a voltage higher than the threshold voltage of DSG transistor 312) to unselect DSG line 908 to turn on DSG transistor 312 in unselect NAND memory string 900 during the pre-pulse stage between the program stage and the verify stage (e.g., as shown in FIG. 10). In some implementations, the control signals sent by program/verify control unit 1204 further cause row decoder/word line driver 508 to apply a select voltage (e.g., a voltage higher than the threshold voltage of target memory cell 306) to select word line 902 to turn on target memory cell 306 in unselect NAND memory string 900 as well during the pre-pulse stage (e.g., as shown in FIG. 10).

Figure 13:
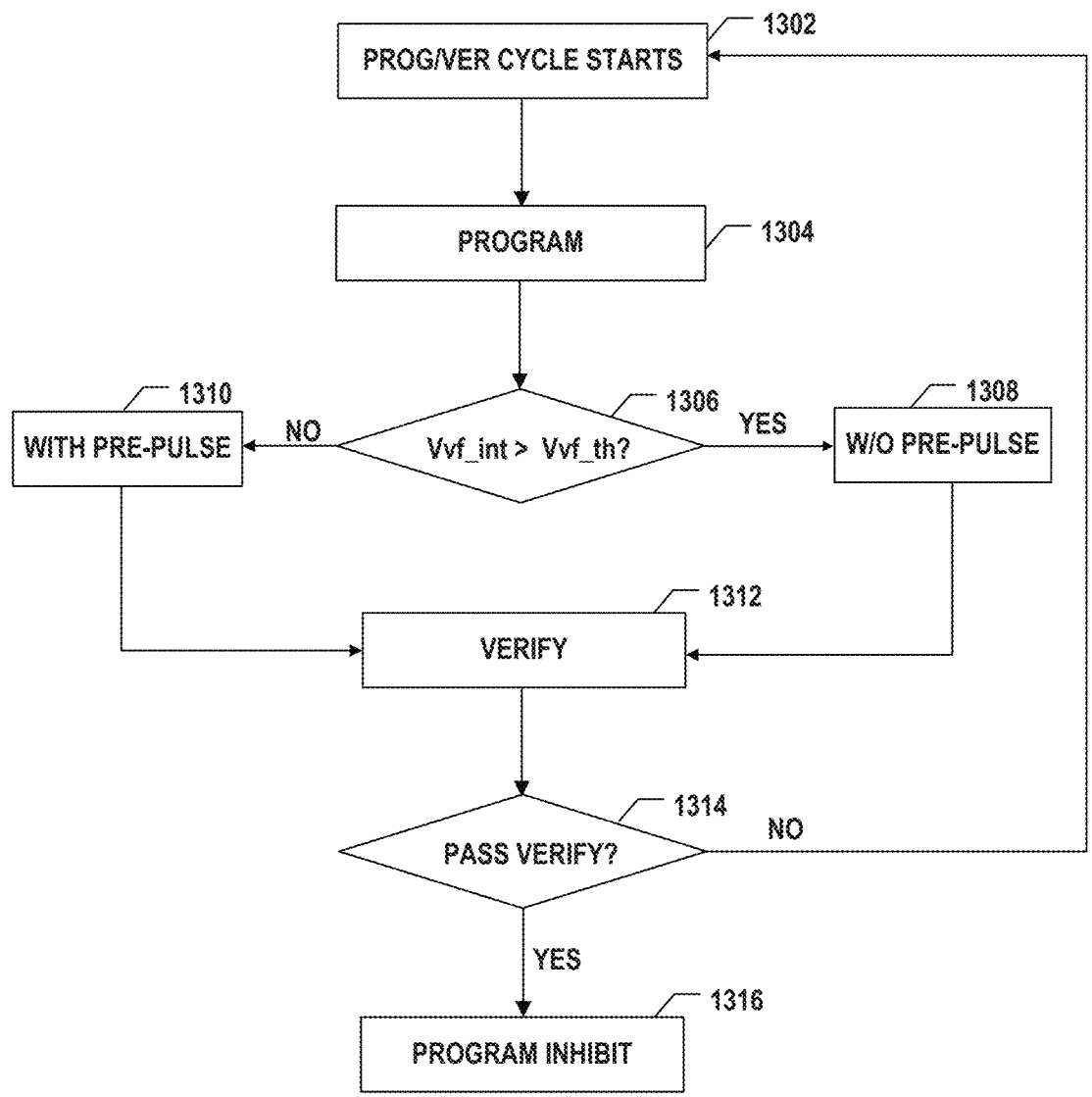
FIG. 13 illustrates a dynamic pre-pulse scheme for a program operation, according to some aspects of the present disclosure.

In summary, FIG. 13 illustrates a dynamic pre-pulse scheme for a program operation, according to some aspects of the present disclosure. A program/verify cycle can start at 1302. At 1304, target memory cells in select NAND memory strings can be programmed, while target memory cells coupled to the same select word line but in unselect NAND memory strings can be inhibited. At 1306, whether the initial verify voltage of the program/verify cycle is higher than the threshold verify voltage is determined. If the initial verify voltage of the program/verify cycle is higher than the threshold verify voltage, the scheme proceeds to 1308 without having a pre-pulse stage before verifying the target memory cells in select NAND memory strings at 1312. Otherwise, the scheme proceeds to 1310 with a pre-pulse stage before verifying the target memory cells in select NAND memory strings at 1312. At 1312, the target memory cells in select NAND memory strings at 1312 can be verified using one or more verified voltages, starting from the initial verify voltage, while the target memory cells coupled to the same select word line, but in unselect NAND memory strings, can still be inhibited. At 1314, whether the target memory cells in select NAND memory strings pass the verification can be determined. If the target memory cell in a select NAND memory string passes the verification, the select NAND memory string having the verification-passed memory cell starts to be inhibited, i.e., becoming unselect NAND memory string, starting at 1316. Otherwise, the scheme returns to 1302 to start a new program/verify cycle to program the remaining verification-failed target memory cells.

As described above with respect to FIG. 7, the verify voltage(s) may vary in different program/verify cycles. In some implementations, low verify voltage(s) are used in early program/verify cycle(s), while high verify voltage(s) are used in late program/verify cycle(s). Thus, in some implementations, the dynamic pre-pulse scheme disclosed herein does not need to be applied to each program/verify cycle in a program operation in those cases. Instead, in one example, for very early program/verify cycle(s) in which the lowest verify voltage(s) are used, since the initial verify voltage is unlikely to be higher than the threshold verify voltage, the pre-pulse stage may be blindly added by default. Moreover, once the initial verify voltage in a program/verify cycle is determined to be higher than the threshold verify voltage, the pre-pulse stage may be blindly skipped by default in all later program/verify cycles. For example, when the initial verify voltage in the current program/verify cycle is lower than another initial verify voltage in a later program/verify cycle, in response to the comparing result indicative of the initial verify voltage being higher than the threshold verify voltage in the current program/verify cycle, in the later program/verify cycle, the DSG transistor may be turned off between programming and verifying the target memory cell without comparing the another initial verify voltage with the threshold verify voltage.

Figure 14:
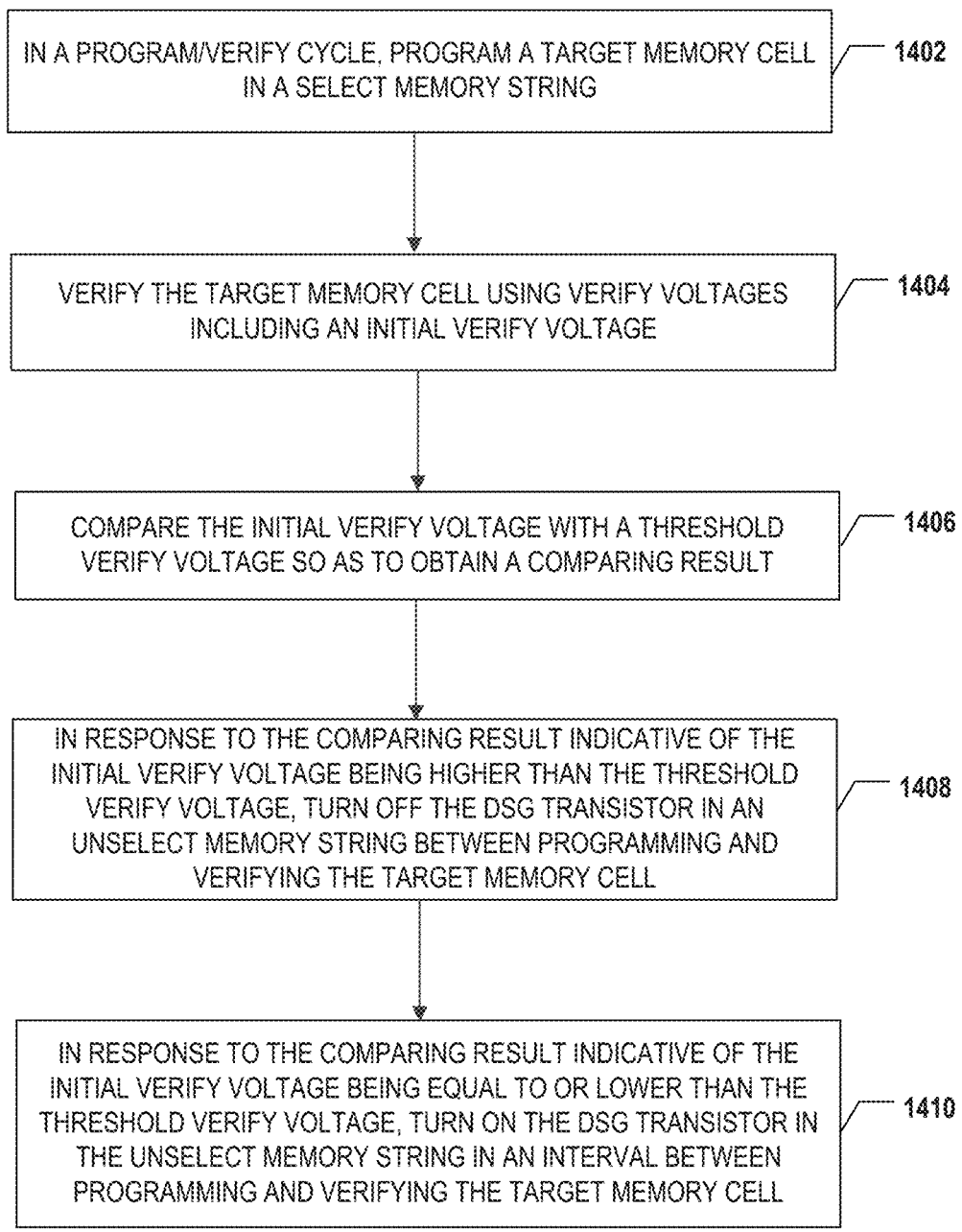
FIG. 14 illustrates a flowchart of a method for operating a memory device, according to some aspects of the present disclosure.

FIG. 14 illustrates a flowchart of a method 1400 for operating a memory device, according to some aspects of the present disclosure. The memory device may be any suitable memory device disclosed herein, such as memory device 300. Method 1400 may be implemented by peripheral circuits 302, such as control logic 512, registers 514, and row decoder/word line driver 508. It is understood that the operations shown in method 1400 may not be exhaustive and that other operations can be performed as well before, after, or between any of the illustrated operations. Further, some of the operations may be performed simultaneously, or in a different order than shown in FIG. 14. For example, operations 1406, 1408, and 1410 may be performed prior to operation 1404.

Referring to FIG. 14, method 1400 starts at operation 1402, in which in a program/verify cycle, a target memory cell in a select memory string is programmed. In some implementations, the DSG transistor in the unselect memory string is turned off when programming the target memory cell. For example, example, in a program/verify cycle, control logic 512 may send control signals to at least row decoder/word line driver 508, column decoder/bit line driver 506, and voltage generator 510 to initiate the program operation on target memory cell 306 coupled to select word line 318 and in select NAND memory string 308. In one example, word line driver 508 may apply a program voltage to select word line 318 to program target memory cell 306 in select NAND memory string 308, as well as an unselect voltage to unselect DSG line 313 to turn off DSG transistor 312 in unselect NAND memory string 308 to inhibit the programming of memory cell 306 in unselect NAND memory string 308.

Method 1400 proceeds to operation 1404, as illustrated in FIG. 14, in which the target memory cell is verified using one or more verify voltages including an initial verify voltage. The initial verify voltage can be the maximum voltage of the one or more verify voltages. In some implementations, the DSG transistor in the unselect memory string is turned off when verifying the target memory cell. In some implementations, to verify the target memory cell, the one or more verify voltages, starting from the initial verify voltage, are sequentially applied to the select word line coupled to the target memory cell, and a pass voltage is applied to an unselect word line coupled to another memory cell of the memory cells in the select memory string. The pass voltage can be higher than the initial verify voltage. For example, control logic 512 may send control signals to at least row decoder/word line driver 508, column decoder/bit line driver 506, voltage generator 510, and page buffer/sense amplifier 504 to verify target memory cell 306 coupled to select word line 318 and in select NAND memory string 308. In one example, word line driver 508 may sequentially apply the verify voltages, starting from the initial verify voltage, to select word line 318 to verify target memory cell 306 in select NAND memory string 308, as well as a pass voltage to each unselect word line 318 to turn on other memory cells 306 in select NAND memory string 308.

Method 1400 proceeds to operation 1406, as illustrated in FIG. 14, in which the initial verify voltage is compared with a threshold verify voltage so as to obtain a comparing result. In some implementations, the threshold verify voltage is determined based, at least in part, on a sequence number of the program/verify cycle among a plurality of program/verify cycles. In some implementations, the threshold verify voltage is determined based, at least in part, on the pass voltage. For example, pre-pulse determining unit 1202 of control logic 512 may obtain the values of initial verify voltage 1206 and threshold verify voltage 1208 from register 514 and compare initial verify voltage 1206 with threshold verify voltage 1208.

The DSG transistor in an unselect memory string of the memory strings can be controlled at least based on the comparing result between programming and verifying the targe memory cell as described below with respect to operations 1408 and 1410.

Method 1400 proceeds to operation 1408, as illustrated in FIG. 14, in which in response to the initial verify voltage being higher than the threshold verify voltage, the DSG transistor in the unselect memory string is turned off between programming and verifying the target memory cell. In some implementations, in response to the initial verify voltage being higher than the threshold verify voltage, a first voltage is applied to the select word line between programming and verifying the target memory cell to turn off a memory cell in the unselect memory string and that is coupled to the select word line. For example, in response to the initial verify voltage being higher than the threshold verify voltage, program/verify control unit 1204 of control logic 512 may send control signals to word line driver 508 to turn off DSG transistor 312 in unselect NAND memory string 308 between programming and verifying target memory cell 306. Word line driver 508 may also apply an unselect voltage to select word line 318 between programming and verifying the target memory cell to turn off a memory cell in unselect NAND memory string 308 and that is coupled to select word line 318.

Method 1400 proceeds to operation 1410, as illustrated in FIG. 14, in which in response to the initial verify voltage being equal to or lower than the threshold verify voltage, the DSG transistor in the unselect memory string is turned on in an interval between programming and verifying the target memory cell. In some implementations, in response to the initial verify voltage being equal to or lower than the threshold verify voltage, a second voltage is applied to the select word line in the interval between programming and verifying the target memory cell to turn on the memory cell in the unselect memory string. For example, in response to the initial verify voltage being equal to or lower than the threshold verify voltage, program/verify control unit 1204 of control logic 512 may send control signals to word line driver 508 to turn on DSG transistor 312 in unselect NAND memory string 308 in an interval between programming and verifying target memory cell 306. Word line driver 508 may also apply a select voltage to select word line 318 in the interval between programming and verifying the target memory cell to turn on the memory cell in unselect NAND memory string 308 and that is coupled to select word line 318.

According to one aspect of the present disclosure, a memory device includes memory strings each including a DSG transistor and memory cells, and a peripheral circuit coupled to the memory strings. The peripheral circuit is configured to, in a program/verify cycle, program a target memory cell of the memory cells in a select memory string of the memory strings, and after programming the target memory cell, verify the target memory cell using one or more verify voltages including an initial verify voltage. The peripheral circuit is also configured to compare the initial verify voltage with a threshold verify voltage so as to obtain a comparing result, and control, at least based on the comparing result, the DSG transistor in an unselect memory string of the memory strings between programming and verifying the targe memory cell.

In some implementations, to control the DSG transistor, the peripheral circuit is configured to, in the program/verify cycle, in response to the comparing result indicative of the initial verify voltage being higher than the threshold verify voltage, turn off the DSG transistor in the unselect memory string between programming and verifying the target memory cell.

In some implementations, to control the DSG transistor, the peripheral circuit is further configured to, in the program/verify cycle, in response to the comparing result indicative of the initial verify voltage being equal to or lower than the threshold verify voltage, turn on the DSG transistor in the unselect memory string in an interval between programming and verifying the target memory cell.

In some implementations, the initial verify voltage is a maximum voltage of the one or more verify voltages.

In some implementations, the threshold verify voltage is determined based, at least in part, on a sequence number of the program/verify cycle among a plurality of program/verify cycles.

In some implementations, the peripheral circuit is further configured to turn off the DSG transistor in the unselect memory string when programming the target memory cell, and turn off the DSG transistor in the unselect memory string when verifying the target memory cell.

In some implementations, the memory device further includes word lines each coupled to the memory cells in the select and unselect memory strings that are in a same respective row. In some implementations, the peripheral circuit includes a word line driver configured to, when verifying the target memory cell, sequentially apply the one or more verify voltages, starting from the initial verify voltage, to a select word line coupled to the target memory cell, and apply a pass voltage to an unselect word line coupled to another memory cell of the memory cells in the select memory string.

In some implementations, the pass voltage is higher than the initial verify voltage.

In some implementations, the threshold verify voltage is determined based, at least in part, on the pass voltage.

In some implementations, the word line driver is further configured to in response to the comparing result indicative of the initial verify voltage being higher than the threshold verify voltage, apply a first voltage to the select word line between programming and verifying the target memory cell, to turn off a memory cell in the unselect memory string and that is coupled to the select word line. In some implementations, the word line driver is further configured to in response to the comparing result indicative of the initial verify voltage being equal to or lower than the threshold verify voltage, apply a second voltage to the select word line in the interval between programming and verifying the target memory cell, to turn on the memory cell in the unselect memory string.

In some implementations, the peripheral circuit is configured to turn on the DSG transistor after verifying the targe memory cell.

In some implementations, the initial verify voltage in the program/verify cycle is lower than another initial verify voltage in a later program/verify cycle, and the peripheral circuit is further configured to, in response to the comparing result indicative of the initial verify voltage being higher than the threshold verify voltage in the program/verify cycle, in the later program/verify cycle, turn off the DSG transistor between programming and verifying the target memory cell without comparing the another initial verify voltage with the threshold verify voltage.

In some implementations, the memory device is a 3D NAND memory device, and the memory strings are NAND memory strings.

According to another aspect of the present disclosure, a memory system includes a memory device configured to store data, and a memory controller coupled to the memory device. The memory device includes memory strings each including a DSG transistor and memory cells, and a peripheral circuit coupled to the memory strings. The peripheral circuit is configured to, in a program/verify cycle, program a target memory cell of the memory cells in a select memory string of the memory strings, and after programming the target memory cell, verify the target memory cell using one or more verify voltages including an initial verify voltage. The peripheral circuit is also configured to compare the initial verify voltage with a threshold verify voltage so as to obtain a comparing result, and control, at least based on the comparing result, the DSG transistor in an unselect memory string of the memory strings between programming and verifying the targe memory cell. The memory controller is configured to control operations of the memory strings through the peripheral circuit.

In some implementations, the memory system includes an SSD or a memory card.

In some implementations, the memory device is a 3D NAND memory device, and the memory strings are NAND memory strings.

According to still another aspect of the present disclosure, a method for operating a memory device is provided. The memory device includes memory strings each including a DSG transistor and memory cells. In a program/verify cycle, a target memory cell of the memory cells in a select memory string of the memory strings is programed. After programming the target memory cell, the target memory cell is verified using one or more verify voltages including an initial verify voltage. The initial verify voltage is compared with a threshold verify voltage so as to obtain a comparing result. The DSG transistor in an unselect memory string of the memory strings is controlled at least based on the comparing result between programming and verifying the targe memory cell.

In some implementations, in the program/verify cycle, to control the DSG transistor, in response to the comparing result indicative of the initial verify voltage being higher than the threshold verify voltage, the DSG transistor in the unselect memory string is turned off between programming and verifying the target memory cell.

In some implementations, in the program/verify cycle, to control the DSG transistor, in response to the comparing result indicative of the initial verify voltage being equal to or lower than the threshold verify voltage, the DSG transistor in the unselect memory string is turned on in an interval between programming and verifying the target memory cell.

In some implementations, the initial verify voltage is a maximum voltage of the one or more verify voltages.

In some implementations, the threshold verify voltage is determined based, at least in part, on a sequence number of the program/verify cycle among a plurality of program/verify cycles.

In some implementations, the DSG transistor in the unselect memory string is turned off when programming the target memory cell, and the DSG transistor in the unselect memory string is turned off when verifying the target memory cell.

In some implementations, the memory device further includes word lines each coupled to the memory cells in the select and unselect memory strings that are in a same respective row. In some implementations, to verify the target memory cell, the one or more verify voltages are sequentially applied, starting from the initial verify voltage, to a select word line coupled to the target memory cell, and a pass voltage is applied to an unselect word line coupled to another memory cell of the memory cells in the select memory string.

In some implementations, the pass voltage is higher than the initial verify voltage.

In some implementations, the threshold verify voltage is determined based, at least in part, on the pass voltage.

In some implementations, in response to the comparing result indicative of the initial verify voltage being higher than the threshold verify voltage, a first voltage is applied to the select word line between programming and verifying the target memory cell, to turn off a memory cell in the unselect memory string and that is coupled to the select word line. In some implementations, in response to the comparing result indicative of the initial verify voltage being equal to or lower than the threshold verify voltage, a second voltage is applied to the select word line in the interval between programming and verifying the target memory cell, to turn on the memory cell in the unselect memory string.

In some implementations, the DSG transistor is turned off after verifying the targe memory cell.

In some implementations, the initial verify voltage in the program/verify cycle is lower than another initial verify voltage in a later program/verify cycle, and in response to the comparing result indicative of the initial verify voltage being higher than the threshold verify voltage in the program/verify cycle, in the later program/verify cycle, the DSG transistor is turned off between programming and verifying the target memory cell without comparing the another initial verify voltage with the threshold verify voltage.

In some implementations, the memory device is a 3D NAND memory device, and the memory strings are NAND memory strings.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
memory strings each comprising a drain select gate (DSG) transistor and memory cells; and
a peripheral circuit coupled to the memory strings and configured to, in a program/verify cycle:
program a target memory cell of the memory cells in a select memory string of the memory strings;
after programming the target memory cell, verify the target memory cell using one or more verify voltages comprising an initial verify voltage;
compare the initial verify voltage with a threshold verify voltage so as to obtain a comparing result; and
control, at least based on the comparing result, the DSG transistor in an unselect memory string of the memory strings between programming and verifying the target memory cell,
wherein to control the DSG transistor, the peripheral circuit is further configured to, in the program/verify cycle, in response to the comparing result indicative of the initial verify voltage being equal to or lower than the threshold verify voltage, turn on the DSG transistor in the unselect memory string in an interval between an end of programming and a start of verifying the target memory cell, and
wherein the initial verify voltage is a maximum voltage of the one or more verify voltages.

2. The memory device of claim 1, wherein to control the DSG transistor, the peripheral circuit is configured to, in the program/verify cycle, in response to the comparing result indicative of the initial verify voltage being higher than the threshold verify voltage, turn off the DSG transistor in the unselect memory string between programming and verifying the target memory cell.

3. The memory device of claim 2, wherein the initial verify voltage in the program/verify cycle is lower than another initial verify voltage in a later program/verify cycle; and
the peripheral circuit is further configured to, in response to the comparing result indicative of the initial verify voltage being higher than the threshold verify voltage in the program/verify cycle, in the later program/verify cycle, turn off the DSG transistor between programming and verifying the target memory cell without comparing the another initial verify voltage with the threshold verify voltage.

4. The memory device of claim 1, wherein the threshold verify voltage is determined based, at least in part, on a sequence number of the program/verify cycle among a plurality of program/verify cycles.

5. The memory device of claim 1, wherein the peripheral circuit is further configured to:
turn off the DSG transistor in the unselect memory string when programming the target memory cell; and
turn off the DSG transistor in the unselect memory string when verifying the target memory cell.

6. The memory device of claim 1, further comprising word lines each coupled to the memory cells in the select and unselect memory strings that are in a same respective row, wherein the peripheral circuit comprises a word line driver configured to, when verifying the target memory cell:
sequentially apply the one or more verify voltages, starting from the initial verify voltage, to a select word line coupled to the target memory cell; and
apply a pass voltage to an unselect word line coupled to another memory cell of the memory cells in the select memory string.

7. The memory device of claim 6, wherein the pass voltage is higher than the initial verify voltage.

8. The memory device of claim 6, wherein the threshold verify voltage is determined based, at least in part, on the pass voltage.

9. The memory device of claim 6, wherein the word line driver is further configured to:
in response to the comparing result indicative of the initial verify voltage being higher than the threshold verify voltage, apply a first voltage to the select word line between programming and verifying the target memory cell, to turn off a memory cell in the unselect memory string and that is coupled to the select word line; and
in response to the comparing result indicative of the initial verify voltage being equal to or lower than the threshold verify voltage, apply a second voltage to the select word line in the interval between programming and verifying the target memory cell, to turn on the memory cell in the unselect memory string.

10. The memory device of claim 1, wherein the peripheral circuit is configured to turn on the DSG transistor after verifying the target memory cell.

11. A memory system, comprising:
a memory device configured to store data and comprising:
memory strings each comprising a drain select gate (DSG) transistor and memory cells; and
a peripheral circuit coupled to the memory strings and configured to, in a program/verify cycle:
program a target memory cell of the memory cells in a select memory string of the memory strings;
after programming the target memory cell, verify the target memory cell using one or more verify voltages comprising an initial verify voltage;
compare the initial verify voltage with a threshold verify voltage so as to obtain a comparing result; and
control, at least based on the comparing result, the DSG transistor in an unselect memory string of the memory strings between programming and verifying the target memory cell,
wherein to control the DSG transistor, the peripheral circuit is further configured to, in the program/verify cycle, in response to the comparing result indicative of the initial verify voltage being equal to or lower than the threshold verify voltage, turn on the DSG transistor in the unselect memory string in an interval between an end of programming and a start of verifying the target memory cell,
wherein the initial verify voltage is a maximum voltage of the one or more verify voltages; and
a memory controller coupled to the memory device and configured to control operations of the memory strings through the peripheral circuit.

12. A method for operating a memory device, the memory device comprising memory strings each comprising a drain select gate (DSG) transistor and memory cells, the method comprising, in a program/verify cycle:
programming a target memory cell of the memory cells in a select memory string of the memory strings;
after programming the target memory cell, verifying the target memory cell using one or more verify voltages comprising an initial verify voltage;

comparing the initial verify voltage with a threshold verify voltage so as to obtain a comparing result; and controlling, at least based on the comparing result, the DSG transistor in an unselect memory string of the memory strings between programming and verifying the target memory cell, wherein controlling the DSG transistor comprises, in the program/verify cycle, in response to the comparing result indicative of the initial verify voltage being equal to or lower than the threshold verify voltage, turning on the DSG transistor in the unselect memory string in an interval between an end of programming and a start of verifying the target memory cell, and wherein the initial verify voltage is a maximum voltage of the one or more verify voltages.

13. The method of claim 12, wherein controlling the DSG transistor comprises, in the program/verify cycle, in response to the comparing result indicative of the initial verify voltage being higher than the threshold verify voltage, turning off the DSG transistor in the unselect memory string between programming and verifying the target memory cell.

14. The method of claim 12, wherein:
the memory device further comprises word lines each coupled to the memory cells in the select and unselect memory strings that are in a same respective row; and
verifying the target memory cell comprises:
sequentially applying the one or more verify voltages, starting from the initial verify voltage, to a select word line coupled to the target memory cell; and
applying a pass voltage to an unselect word line coupled to another memory cell of the memory cells in the select memory string.

15. The method of claim 14, wherein the threshold verify voltage is determined based, at least in part, on the pass voltage.

16. The method of claim 14, further comprising:
in response to the comparing result indicative of the initial verify voltage being higher than the threshold verify voltage, applying a first voltage to the select word line between programming and verifying the target memory cell to turn off a memory cell in the unselect memory string and that is coupled to the select word line; and
in response to the comparing result indicative of the initial verify voltage being equal to or lower than the threshold verify voltage, applying a second voltage to the select word line in the interval between programming and verifying the target memory cell to turn on the memory cell in the unselect memory string.

* * * * *